US008053077B2

(12) United States Patent
Braidwood et al.

(10) Patent No.: US 8,053,077 B2
(45) Date of Patent: Nov. 8, 2011

(54) COMPOSITE-FORMING METHOD, COMPOSITES FORMED THEREBY, AND PRINTED CIRCUIT BOARDS INCORPORATING THEM

(75) Inventors: Christina Louise Braidwood, Niskayuna, NY (US); Hua Guo, Selkirk, NY (US); Edward Norman Peters, Lenox, MA (US)

(73) Assignee: Sabic Innovative Plastics IP B.V. (NL)

( * ) Notice: Subject to any disclaimer, the term of this patent is extended or adjusted under 35 U.S.C. 154(b) by 0 days.

(21) Appl. No.: 12/617,033

(22) Filed: Nov. 12, 2009

(65) Prior Publication Data

US 2010/0084170 A1   Apr. 8, 2010

Related U.S. Application Data

(62) Division of application No. 11/670,813, filed on Feb. 2, 2007, now Pat. No. 7,655,278.

(60) Provisional application No. 60/887,216, filed on Jan. 30, 2007.

(51) Int. Cl.
*B32B 27/38* (2006.01)
(52) U.S. Cl. ........................................ 428/413; 428/901
(58) Field of Classification Search .................. 428/413, 428/901
See application file for complete search history.

(56) References Cited

U.S. PATENT DOCUMENTS

| | | | |
|---|---|---|---|
| 3,334,110 A | 8/1967 | Schramm et al. | |
| 3,496,236 A | 2/1970 | Cooper et al. | |
| 4,521,584 A * | 6/1985 | Heitz et al. | 528/214 |
| H521 H | 9/1988 | Fan | |
| 4,912,172 A | 3/1990 | Hallgren | |
| 5,071,922 A | 12/1991 | Nelissen et al. | |
| 5,079,268 A | 1/1992 | Nelissen et al. | |
| 5,089,343 A | 2/1992 | Colborn et al. | |
| 5,162,450 A | 11/1992 | Chao et al. | |
| 5,218,030 A | 6/1993 | Katayose et al. | |
| 5,304,600 A | 4/1994 | Nelissen et al. | |
| 5,407,972 A | 4/1995 | Smith et al. | |
| 5,582,872 A | 12/1996 | Prinz | |
| 5,622,588 A | 4/1997 | Weber | |
| 5,834,565 A * | 11/1998 | Tracy et al. | 525/391 |
| 5,880,221 A | 3/1999 | Lisha et al. | |
| 5,965,663 A | 10/1999 | Hayase | |
| 6,306,963 B1 | 10/2001 | Lane et al. | |
| 6,333,064 B1 | 12/2001 | Gan | |
| 6,352,782 B2 | 3/2002 | Yeager et al. | |
| 6,558,783 B1 | 5/2003 | Kato et al. | |
| 6,569,982 B2 | 5/2003 | Hwang et al. | |
| 6,617,398 B2 | 9/2003 | Yeager et al. | |
| 6,627,704 B2 | 9/2003 | Yeager et al. | |
| 6,835,785 B2 | 12/2004 | Ishii et al. | |
| 6,841,252 B2 | 1/2005 | Kroes | |
| 6,897,282 B2 | 5/2005 | Freshour et al. | |
| 6,995,195 B2 | 2/2006 | Ishii et al. | |
| 7,067,595 B2 | 6/2006 | Zarnoch et al. | |
| 2003/0220460 A1 | 11/2003 | Merfeld | |
| 2003/0229256 A1 * | 12/2003 | Ishii et al. | 568/660 |
| 2004/0102583 A1 | 5/2004 | Freshour et al. | |
| 2004/0147715 A1 | 7/2004 | Ishii et al. | |
| 2004/0152848 A1 * | 8/2004 | Ishii et al. | 525/452 |
| 2004/0214004 A1 * | 10/2004 | Amagai et al. | 428/413 |
| 2005/0065241 A1 | 3/2005 | Ishii et al. | |
| 2005/0070685 A1 * | 3/2005 | Mitsui et al. | 528/217 |
| 2006/0041086 A1 | 2/2006 | Birsak et al. | |
| 2007/0066710 A1 | 3/2007 | Peters et al. | |
| 2007/0135609 A1 | 6/2007 | Carrillo et al. | |

FOREIGN PATENT DOCUMENTS

| | | |
|---|---|---|
| EP | 0494722 A | 7/1992 |
| EP | 0921158 A | 6/1999 |
| EP | 1167484 A | 1/2002 |
| EP | 1630199 A1 | 3/2006 |
| WO | 01/40354 A1 | 6/2001 |

OTHER PUBLICATIONS

"The Synthesis of Poly(arylene ether)s in Solution at Pilot-Plant Scale with Control over Molecular Weight and End-Group Composition" Timothy P. Bender, Richard A. Burt, Gord K. Hamer, Christine DeVisser, Paul F. Smith, and, Marko Saban Organic Process Research & Development 2002 6 (5), 714-720.*
JP2004059596; Feb. 26, 2004; Abstract Only (1 page).
International Search Report; International Application No. PCT/US2008/051759; International Filing Date Jan. 23, 2008; 3 pages.
Written Opinion of the International Searching Authority; International Application No. PCT/US2008/051759; International Filing Date Jan. 23, 2008; 5 pages.
ASTM D790-03 Standard Test Methods for Flexural Properties of Unreinforced and Reinforced Plastics and Electrical Insulating Materials (11 pages), (2003).
ASTM D792-00, Standard Test Methods for Density and Specific Gravity (Relative Density) of Plastics by Displacement (6 pages) (2000).
Bob Griffith's, Farnborough Airshow Report 2006, CompositesWorld.com, Sep. 2006, available at http://www.compositesworld.com/hpc/issues/2006/September/1423/1 (last visited Dec. 18, 2006).
Prepreg Technology, Mar. 2005, Publication No. FGU 017b, available at http://www.hexcel.com/NR/rdonlyres/230A6C2A-FDFA-4EC7-B048-E4EB28E3BC8C/0/Prepreg Technology2.pdf (last visited Dec. 18, 2006).

(Continued)

*Primary Examiner* — Callie Shosho
*Assistant Examiner* — John Freeman
(74) *Attorney, Agent, or Firm* — Cantor Colburn LLP

(57) ABSTRACT

A composite-forming process includes impregnating a reinforcing structure with a curable composition at a temperature of about 10 to about 40° C. The curable composition includes specific amounts of an epoxy resin, a poly(arylene ether), a solvent, and a curing promoter. The poly(arylene ether) includes, on average, about 1.6 to about 2.4 phenolic hydroxy groups per molecule, and it has a polydispersity index less than or equal to 2.2 and an intrinsic viscosity of about 0.03 to about 0.2 deciliter per gram. These characteristics substantially improve the solubility of the poly(arylene ether) in the curable composition and allow the curable composition to be formed and used at or near room temperature. Composites formed by the process and circuit boards including the composites are also described.

16 Claims, No Drawings

OTHER PUBLICATIONS

Advanced Fibre Reinforced Matrix Products for Direct Processes, Jun. 2005, Publication No. ITA 272, available at http://www.hexcel.com/NR/rdonlyres/3208F5FA-E103-4172-BF08-D364B89EA3D7/0/AdvancedFibreReinforcedMatrixProductsforDirectProcesses2.pdf (last visited Dec. 18, 2006).

Dwain M. White, Reactions of Poly(phenylene Oxide)s with Quinones. I. The Quinone-Coupling Reaction Between Low-Molecular-Weight Poly(2,6-Dimethyl-1,4-Phenylene Oxide) and 3, 3', 5, 5'-Tetramethyl-4, 4'Diphenoquinone, Journal of Polymer Science, Polymer Chemistry Edition, vol. 19, 1367-1383 (1981).

Dwain M. White, Polymerization by Oxidative Coupling. II. Co-Redistribution of Poly(2, 6-diphenyl-1, 4-phenylene Ether) with Phenols, Journal of Polymer Science: Part A-1, vol. 9, 663-675 (1971).

* cited by examiner

COMPOSITE-FORMING METHOD, COMPOSITES FORMED THEREBY, AND PRINTED CIRCUIT BOARDS INCORPORATING THEM

CROSS REFERENCE TO RELATED APPLICATIONS

This application is a Division of U.S. application Ser. No. 11/670,813 filed Feb. 2, 2007 now U.S. Pat. No. 7,655,278, which claims priority to U.S. Provisional Application Ser. No. 60/887,216, filed Jan. 30, 2007, which is hereby incorporated by reference in its entirety.

BACKGROUND OF THE INVENTION

Epoxy resins are high performance materials used in a wide variety of applications including protective coatings, adhesives, electronic laminates (such as those used in the fabrication of computer circuit boards), flooring and paving applications, glass fiber-reinforced pipes, and automotive parts (including leaf springs, pumps, and electrical components). In their cured form, epoxy resins offer desirable properties including good adhesion to other materials, excellent resistance to corrosion and chemicals, high tensile strength, and good electrical resistance. Two challenges associated with the use of epoxy resins are the brittleness of the cured epoxy resins and the need to heat many curable epoxy compositions enough to prepare and blend and shape them but not so much as to cure them prematurely.

Poly(arylene ether) resin is a type of plastic known for its excellent water resistance, dimensional stability, and inherent flame retardancy. It is known that the brittleness of epoxy resins can be reduced the addition of poly(arylene ether)s. For example, U.S. Pat. No. 4,912,172 to Hallgren et al. describes a composition including a polyphenylene ether having a number average molecular weight of at least about 12,000 and a specific epoxy material. However, relatively high temperatures are required to dissolve the polyphenylene ether in the epoxy resin.

As another example, U.S. Pat. No. 5,834,565 to Tracy et al. describes compositions including an epoxy resin and a poly(arylene ether) having a number average molecular weight less than 3,000. The low molecular weight poly(arylene ether) is easier to dissolve in the epoxy resin than higher molecular weight poly(arylene ether)s. However, the products obtained on curing these compositions are not as tough as those prepared with higher molecular weight polyphenylene ethers.

Known curable compositions comprising poly(arylene ether)s and epoxy resins thus appear to present a trade-off between toughness of the cured product and ease of preparing and processing the curable composition. When a high molecular weight poly(arylene ether) is employed, the cured product is very tough, but elevated temperatures are required to dissolve the poly(arylene ether) in the epoxy resin. On the other hand, when a low molecular weight poly(arylene ether) is employed, it is possible to dissolve the poly(arylene ether) in the epoxy resin at a lower temperature, but smaller improvements in toughness are observed in the cured product.

There remains a need for curable epoxy compositions that can be processed at low temperature yet be extremely tough (less brittle) after curing. This need is particularly great in the field of circuit board manufacturing, where improvements in toughness are needed, but existing processes and equipment cannot accommodate curable compositions that must be prepared and maintained at high temperatures to maintain dissolution of a poly(arylene ether).

BRIEF DESCRIPTION OF THE INVENTION

The above-described and other drawbacks are alleviated by a method comprising: impregnating a reinforcing structure with a curable composition at a temperature of about 10 to about 40° C., wherein the curable composition comprises about 30 to about 80 parts by weight of an epoxy resin, about 20 to about 60 parts by weight of a polyfunctional poly(arylene ether) having a polydispersity index less than or equal to 2.2 and an intrinsic viscosity of about 0.03 to about 0.2 deciliter per gram measured in chloroform at 25° C., about 2 to about 100 parts by weight of a solvent having an atmospheric boiling point of about 50 to about 250° C., and an amount of a curing promoter effective to cure the epoxy resin; wherein all parts by weight are based on 100 parts by weight total of the epoxy resin and the bifunctional poly(arylene ether).

Another embodiment is a method comprising: impregnating a reinforcing fabric with a curable composition at a temperature of about 10 to about 40° C., wherein the curable composition comprises about 30 to about 80 parts by weight of an epoxy resin, about 20 to about 60 parts by weight of a bifunctional poly(arylene ether) having a polydispersity index less than or equal to 2.2 and an intrinsic viscosity of about 0.03 to about 0.2 deciliter per gram measured in chloroform at 25° C., about 2 to about 100 parts by weight of a solvent having an atmospheric boiling point of about 50 to about 250° C., and an amount of a curing promoter effective to cure the epoxy resin; wherein all parts by weight are based on 100 parts by weight total of the epoxy resin and the bifunctional poly(arylene ether).

Another embodiment is a method of forming a composite, comprising: impregnating a reinforcing structure with a curable composition at a temperature of about 10 to about 40° C., wherein the curable composition consists of about 30 to about 80 parts by weight of an epoxy resin, about 20 to about 60 parts by weight of a polyfunctional poly(arylene ether) having a polydispersity index less than or equal to 2.2 and an intrinsic viscosity of about 0.03 to about 0.2 deciliter per gram measured in chloroform at 25° C., about 2 to about 100 parts by weight of a solvent having an atmospheric boiling point of about 50 to about 250° C., an amount of a curing promoter effective to cure the epoxy resin, and, optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof; wherein all parts by weight are based on 100 parts by weight total of the epoxy resin and the polyfunctional poly(arylene ether).

Another embodiment is a method of forming a composite, comprising: impregnating a reinforcing structure with a curable composition at a temperature of about 15 to about 30° C., wherein the curable composition comprises about 40 to about 70 parts by weight of bisphenol A diglycidyl ether epoxy resin, about 30 to about 60 parts by weight of a bifunctional poly(arylene ether) having a polydispersity index less than or equal to 2.2 and an intrinsic viscosity of about 0.06 to about 0.12 deciliter per gram measured in chloroform at 25° C., wherein the bifunctional poly(arylene ether) has the structure

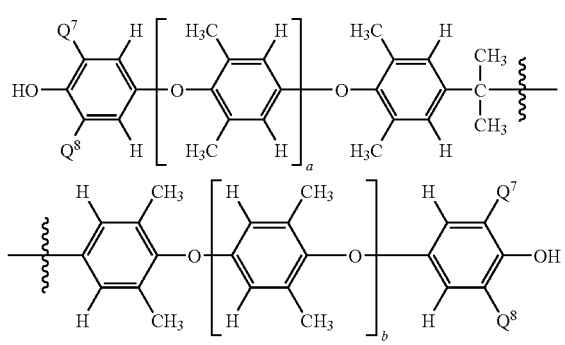

wherein each occurrence of $Q^7$ and $Q^8$ is independently methyl or di-n-butylaminomethyl; and each occurrence of a and b is independently 0 to about 20, with the proviso that the sum of a and b is at least 2, about 10 to about 60 parts by weight of a solvent selected from the group consisting of toluene, methyl ethyl ketone, and mixtures thereof; about 4 to about 12 parts by weight of diethyl toluene diamine, and about 0.05 to about 1 parts by weight of 2-ethyl-4-methylimidazole; wherein all parts by weight are based on 100 parts by weight total of the epoxy resin and the bifunctional poly(arylene ether); and partially curing the curable composition.

Another embodiment is a method of forming a composite, comprising: impregnating a reinforcing structure with a curable composition at a temperature of about 15 to about 30° C., wherein the curable composition consists of about 40 to about 70 parts by weight of bisphenol A diglycidyl ether epoxy resin, about 30 to about 60 parts by weight of a bifunctional poly(arylene ether) having a polydispersity index less than or equal to 2.2 and an intrinsic viscosity of about 0.06 to about 0.12 deciliter per gram measured in chloroform at 25° C., wherein the bifunctional poly(arylene ether) has the structure

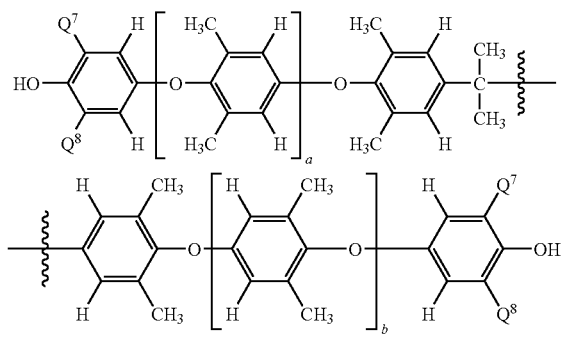

wherein each occurrence of $Q^7$ and $Q^8$ is independently methyl or di-n-butylaminomethyl; and each occurrence of a and b is independently 0 to about 20, with the proviso that the sum of a and b is at least 2, about 10 to about 60 parts by weight of a solvent selected from the group consisting of toluene, methyl ethyl ketone, and mixtures thereof; about 4 to about 12 parts by weight of diethyl toluene diamine, about 0.05 to about 1 parts by weight of 2-ethyl-4-methylimidazole, and, optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof; wherein all parts by weight are based on 100 parts by weight total of the epoxy resin and the bifunctional poly(arylene ether); and partially curing the curable composition.

Another embodiment is a composite prepared by any of the above methods and exhibiting one or more of a water absorption less than or equal to 0.2 weight percent after 24 hours immersion in water at 23° C.; a methylene chloride absorption less than or equal to 1.3 weight percent after 30 minutes immersion in methylene chloride at 23° C. followed by 10 minutes in air at 23° C.; a dielectric constant less than or equal to 3.4 measured at 23° C. and 2.4 gigahertz; and a dissipation factor less than or equal to 0.015 measured at 23° C. and 2.4 gigahertz.

Another embodiment is a printed circuit board, comprising: a composite formed by a method comprising impregnating a reinforcing structure with a curable composition at a temperature of about 10 to about 40° C.; wherein the curable composition comprises about 30 to about 80 parts by weight of an epoxy resin, about 20 to about 60 parts by weight of a bifunctional poly(arylene ether) having a polydispersity index less than or equal to 2.2 and an intrinsic viscosity of about 0.03 to about 0.2 deciliter per gram measured in chloroform at 25° C., about 2 to about 100 parts by weight of a solvent having an atmospheric boiling point of about 50 to about 250° C., and an amount of a curing promoter effective to cure the epoxy resin; wherein all parts by weight are based on 100 parts by weight total of the epoxy resin and the bifunctional poly(arylene ether).

Another embodiment is a printed circuit board, comprising: a composite formed by a method comprising impregnating a reinforcing structure with a curable composition at a temperature of about 10 to about 40° C.; wherein the curable composition consists of about 30 to about 80 parts by weight of an epoxy resin, about 20 to about 60 parts by weight of a bifunctional poly(arylene ether) having a polydispersity index less than or equal to 2.2 and an intrinsic viscosity of about 0.03 to about 0.2 deciliter per gram measured in chloroform at 25° C., about 2 to about 100 parts by weight of a solvent having an atmospheric boiling point of about 50 to about 250° C., an amount of a curing promoter effective to cure the epoxy resin, and, optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof; wherein all parts by weight are based on 100 parts by weight total of the epoxy resin and the bifunctional poly(arylene ether).

These and other embodiments are described in detail below.

DETAILED DESCRIPTION OF THE INVENTION

The present inventors have conducted research on curable poly(arylene ether) compositions in an effort to break out of the previous constraints of poly(arylene ether) solubility in the curable composition versus toughness of the resulting cured resin. In the course of this research, the present inventors have discovered that by using a poly(arylene ether) resin having a particular hydroxyl group functionality, a particular intrinsic viscosity, and a particular molecular weight distribution (polydispersity index), the solubility of the poly(arylene ether)s in the curable composition can be unexpectedly improved without sacrificing toughness in the composition after curing. Alternatively, the toughness of the composition after curing can be improved without sacrificing the solubility of the poly(arylene ether)s in the curable composition. Thus, one embodiment is a method of forming a composite, comprising: impregnating a reinforcing structure with a curable composition at a temperature of about 10 to about 40° C., wherein the curable composition comprises about 30 to about 80 parts by weight of an epoxy resin, about 20 to about 60 parts by weight of a polyfunctional poly (arylene ether) having a polydispersity index less than or equal to 2.2 and an intrinsic viscosity of about 0.03 to about 0.2 deciliter per gram measured in chloroform at 25° C., about 2 to about 100 parts by weight of a solvent having an atmospheric boiling point of about 50 to about 250° C., and an amount of a curing promoter effective to cure the epoxy resin; wherein all parts by weight are based on 100 parts by weight total of the epoxy resin and the polyfunctional poly(arylene ether).

One advantage of the method over previous methods using poly(arylene ether)-containing curable compositions is that it allows impregnation of the reinforcing structure at the relatively low temperature of about 10 to about 40° C. Specifically, the temperature may be about 15 to about 35° C., more specifically about 20 to about 30° C., even more specifically about 20 to about 25° C. Thus, in some embodiments, the markedly improved solubility of the poly(arylene ether) in the curable composition allows room temperature impregnation of the reinforcing structure with curable composition.

Another advantage of the method over previous methods using poly(arylene ether)-containing curable compositions is that the curable composition exhibits a low viscosity at relatively high poly(arylene ether) content. Thus, in some embodiments, the curable composition has a viscosity less than or equal to 2,500 centipoise at 23° C., specifically less than or equal to 2,000 centipoise at 23° C., more specifically less than or equal to 1,500 centipoise, still more specifically less than or equal to 1,000 centipoise at 23° C., even more specifically less than or equal to 800 centipoise at 23° C. In some embodiments, the curable composition viscosity at 23° C. is about 50 to 2,500 centipoise, specifically about 75 to about 2,000 centipoise, more specifically about 100 to about 1,500 centipoise, even more specifically about 100 to about 1,000 centipoise. Those skilled in the thermoset arts know how to measure viscosities of curable compositions. For example, viscosity values may be measured using a Brookfield digital Viscometer, Model DV-II, following the procedure in accompanying Manufacturing Operation Manual No. m/85-160-G.

Reinforcing structures suitable for preform formation are known in the art. Suitable reinforcing structures include reinforcing fabrics. Reinforcing fabrics include those having complex architectures, including two or three-dimensional braided, knitted, woven, and filament wound. The curable composition is capable of permeating such complex preforms. The reinforcing structure may comprise fibers of materials known for the reinforcement of plastics material, for example of carbon, glass, metal, and aromatic polyamides. Suitable reinforcing structures are described, for example, in Anonymous (Hexcel Corporation), "Prepreg Technology", March 2005, Publication No. FGU 017b, available at http://www.hexcel.com/NR/rdonlyres/230A6C2A-FDFA-4EC7-B048-E4EB28E3BC8C/0/PrepregTechnology2.pdf (last visited Dec. 18, 2006); Anonymous (Hexcel Corporation), "Advanced Fibre Reinforced Matrix Products for Direct Processes", June 2005, Publication No. ITA 272, available at http://www.hexcel.com/NR/rdonlyres/3208F5FA-E1C3-4172-BF08-D364B89EA3D7/0/AdvancedFibre-ReinforcedMatrixProductsforDirectProcesses2.pdf (last visited Dec. 18, 2006); and Bob Griffiths, "Farnborough Airshow Report 2006", CompositesWorld.com, September 2006, available at http://www.compositesworld.com/hpc/issues/2006/September/1423/1 (last visited Dec. 18, 2006). The weight and thickness of the reinforcing structure are chosen according to the intended use of the composite using criteria well known to those skilled in the production of fiber reinforced resin composites. The reinforced structure may contain various finishes suitable to the epoxy system.

The curable composition comprises about 30 to about 80 parts by weight of an epoxy resin, based on 100 parts by weight total of the epoxy resin and the polyfunctional poly (arylene ether). Specifically, the epoxy resin amount may be about 40 to about 70 parts by weight, more specifically about 50 to about 60 parts by weight.

Suitable epoxy resins include those described by the structure

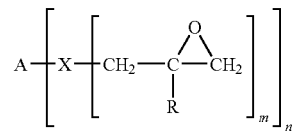

wherein A is a an organic or inorganic radical of valence n, X is oxygen or nitrogen, m is 1 or 2 and consistent with the valence of X, R is hydrogen or methyl, n is 1 to about 1000, specifically 1 to 8, more specifically 2 or 3 or 4.

Suitable classes of epoxy resins include, for example, aliphatic epoxy resins, cycloaliphatic epoxy resins, bisphenol A epoxy resins, bisphenol-F epoxy resins, phenol novolac epoxy resins, cre sol-novolac epoxy resins, biphenyl epoxy resins, polyfunctional epoxy resins, naphthalene epoxy resins, divinylbenzene dioxide, 2-glycidylphenylglycidyl ether, dicyclopentadiene-type epoxy resins, multi aromatic resin type epoxy resins, and the like, and combinations thereof.

Suitable epoxies include those having the following structures

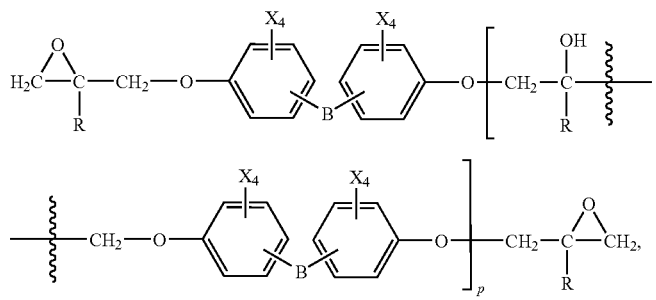

-continued

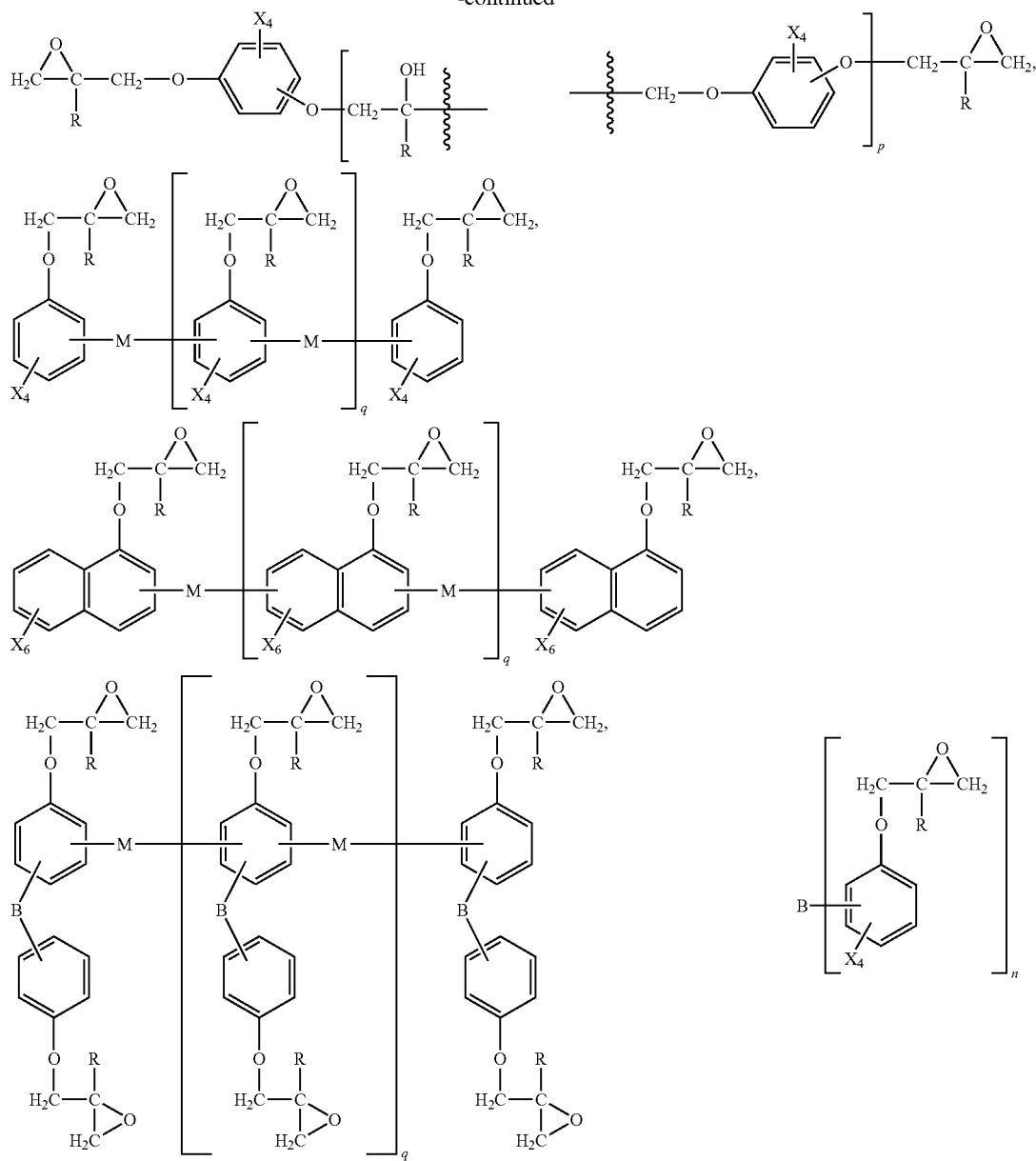

wherein each occurrence of R is independently hydrogen or methyl; each occurrence of M is independently $C_1$-$C_{18}$ hydrocarbylene optionally further comprising a member or members selected from oxirane, carboxy, carboxamide, ketone, aldehyde, alcohol, halogen, nitrile; each occurrence of X is independently hydrogen, chloro, fluoro, bromo, $C_1$-$C_{18}$ hydrocarbyl optionally further comprising a member or members selected from carboxy, carboxamide, ketone, aldehyde, alcohol, halogen, and nitrile; each occurrence of B is independently a carbon-carbon single bond, $C_1$-$C_{18}$ hydrocarbyl, $C_1$-$C_{12}$ hydrocarbyloxy, $C_1$-$C_{12}$ hydrocarbylthio, carbonyl, sulfide, sulfonyl, sulfinyl, phosphoryl, silane, or such groups further comprising a member or members selected from carboxyalkyl, carboxamide, ketone, aldehyde, alcohol, halogen, and nitrile; n is 1 to about 20; and each occurrence of p and q is independently 0 to about 20.

Suitable epoxy resins of the present invention included those produced by the reaction of epichlorohydrin or epibromohydrin with a phenolic compound. Suitable phenolic compounds include resorcinol, catechol, hydroquinone, 2,6-dihydroxynaphthalene, 2,7-dihydroxynapthalene, 2-(diphenylphosphoryl)hydroquinone, bis(2,6-dimethylphenol) 2,2'-biphenol, 4,4-biphenol, 2,2',6,6'-tetramethylbiphenol, 2,2',3,3',6,6'-hexamethylbiphenol, 3,3',5,5'-tetrabromo-2,2'6,6'-tetramethylbiphenol, 3,3'-dibromo-2,2',6,6'-tetramethylbiphenol, 2,2',6,6'-tetramethyl-3,3'5-dibromobiphenol, 4,4'-isopropylidenediphenol (bisphenol A), 4,4'-isopropylidenebis(2,6-dibromophenol) (tetrabromobisphenol A), 4,4'-isopropylidenebis(2,6-dimethylphenol) (teramethylbisphenol A), 4,4'-isopropylidenebis(2-methylphenol), 4,4'-isopropylidenebis(2-allylphenol), 4,4'-(1,3-phenylenediisopropylidene)bisphenol (bisphenol M), 4,4'-isopropylidenebis(3-phenylphenol), 4,4'-(1,4-phenylenediisoproylidene)bisphenol (bisphenol P), 4,4'-ethylidenediphenol (bisphenol E), 4,4'-oxydiphenol, 4,4'-thiodiphenol, 4,4'-thiobis(2,6-dimethylphenol), 4,4'- sulfonyldiphenol, 4,4'-sulfonylbis(2,6-dimethylphenol) 4,4'-sulfinyldiphenol, 4,4'-hexafluoroisoproylidene)bisphenol (Bisphenol AF), 4,4'-(1-phenylethylidene)bisphenol (Bisphenol AP), bis(4-hydroxyphenyl)-2,2-dichloroethylene (Bisphenol C), bis(4-hydroxyphenyl)methane (Bisphenol-F), bis(2,6-dimethyl-4-hydroxyphenyl)methane, 4,4'-(cyclopentylidene)diphenol, 4,4'-(cyclohexylidene)diphenol (Bisphenol Z), 4,4'-(cyclododecylidene)diphenol 4,4'-(bicyclo[2.2.1]heptylidene)diphenol, 4,4'-(9H-fluorene-9,9-diyl)diphenol, 3,3-bis(4-hydroxyphenyl)isobenzofuran-1(3H)-one, 1-(4-hydroxyphenyl)-3,3-dimethyl-2,3-dihydro-1H-inden-5-ol, 1-(4-hydroxy-3,5-dimethylphenyl)-1,3,3,4,6-pentamethyl-2,3-dihydro-1H-inden-5-ol, 3,3,3',3'-tetramethyl-2,2',3,3'-tetrahydro-1,1'-spirobi[indene]-5,6'-diol(spirobiindane), dihydroxybenzophenone (bisphenol K), tris(4-hydroxyphenyl)methane, tris(4-hydroxyphenyl)ethane, tris(4-hydroxyphenyl)propane, tris(4-hydroxyphenyl)butane, tris(3-methyl-4-hydroxyphenyl)methane, tris(3,5-dimethyl-4-hydroxyphenyl)methane, tetrakis(4-hydroxyphenyl)ethane, tetrakis(3,5-dimethyl-4-hydroxyphenyl)ethane, bis(4-hydroxyphenyl)phenylphosphine oxide, dicyclopentadienylbis(2,6-dimethyl phenol), dicyclopentadienyl bis(2-methylphenol), dicyclopentadienyl bisphenol, and the like. In some embodiments, the epoxy resin comprises a bisphenol A diglycidyl ether epoxy resin.

Other suitable epoxy resins include N-glycidyl phthalimide, N-glycidyl tetrahydrophthalimide, phenyl glycidyl ether, p-butylphenyl glycidyl ether, styrene oxide, neohexene oxide, ethylene glycol diglycidyl ether, polyethylene glycol diglycidyl ether, propylene glycol diglycidyl ether, polypropylene glycol diglycidyl ether, tetramethyleneglycol diglycidyl ether, polytetramethylene glycol diglycidyl ether, bisphenol A-type epoxy compounds, bisphenol S-type epoxy compounds, resorcinol-type epoxy compounds, phenolnovolac-type epoxy compounds, ortho-cresolnovolac-type epoxy compounds, adipic acid diglycidyl ester, sebacic acid diglycidyl ester, and phthalic acid diglycidyl ester. Also included are the glycidyl ethers of phenolic resins such as the glycidyl ethers of phenol-formaldehyde novolac, alkyl substituted phenol-formaldehyde resins including cresol-formaldehyde novolac, t-butylphenol-formaldehyde novolac, sec-butylphenol-formaldehyde novolac, tert-octylphenol-formaldehyde novolac, cumylphenol-formaldehyde novolac, decylphenol-formaldehyde novolac. Other useful epoxies are the glycidyl ethers of bromophenol-formaldehyde novolac, chlorophenol-formaldehyde novolac, phenol-bis(hydroxymethyl)benzene novolac, phenol-bis(hydroxymethylbiphenyl) novolac, phenol-hydroxybenzaldehyde novolac, phenol-dicylcopentadiene novolac, naphthol-formaldehyde novolac, naphthol-bis(hydroxymethyl)benzene novolac, naphthol-bis(hydroxymethylbiphenyl)novolac, naphthol-hydroxybenzaldehyde novolac, and naphthol-dicylcopentadiene novolac.

Also suitable as epoxy resins are the polyglycidyl ethers of polyhydric aliphatic alcohols. Examples of such polyhydric alcohols that may be mentioned are 1,4-butanediol, 1,6-hexanediol, polyalkylene glycols, glycerol, trimethylolpropane, 2,2-bis(4-hydroxy-cyclohexyl)propane, and pentaerythritol.

Further suitable epoxy resins are polyglycidyl esters which are obtained by reacting epichlorohydrin or similar epoxy compounds with an aliphatic, cycloaliphatic, or aromatic polycarboxylic acid, such as oxalic acid, adipic acid, glutaric acid, phthalic, isophthalic, terephthalic, tetrahydrophthalic or hexahydrophthalic acid, 2,6-naphthalenedicarboxylic acid, and dimerized fatty acids. Examples are diglycidyl terephthalate and diglycidyl hexahydrophthalate. Moreover, polyepoxide compounds which contain the epoxide groups in random distribution over the molecule chain and which can be prepared by emulsion copolymerization using olefinically unsaturated compounds that contain these epoxide groups, such as, for example, glycidyl esters of acrylic or methacrylic acid, can be employed with advantage in some cases.

Examples of further epoxy resins that can be used are those based on heterocyclic ring systems, for example hydantoin epoxy resins, triglycidyl isocyanurate and its oligomers, triglycidyl-p-aminophenol, triglycidyl-p-aminodiphenyl ether, tetraglycidyldiaminodiphenylmethane, tetraglycidyldiaminodiphenyl ether, tetrakis(4-glycidyloxyphenyl)ethane, urazole epoxides, uracil epoxides, and oxazolidinone-modified epoxy resins. Other examples are polyepoxides based on aromatic amines, such as aniline, for example N,N-diglycidylaniline, diaminodiphenylmethane and N,N-dimethylaminodiphenylmethane or N,N-dimethylaminodiphenyl sulfone and cycloaliphatic epoxy resins such as 3,4-epoxycyclohexylmethyl-3,4-epoxycyclohexane carboxylate, 4,4'-(1,2-epoxyethyl)biphenyl, 4,4'-di(1,2-epoxyethyl)diphenyl ether, and bis(2,3-epoxycyclopentyl)ether.

Oxazolidinone-modified epoxy resins are also suitable. Compounds of this kind are known. See, for example, *Angew. Makromol. Chem.*, vol. 44, (1975), pages 151-163, and U.S. Pat. No. 3,334,110 to Schramm. An example is the reaction product of bisphenol A diglycidyl ether with diphenylmethane diisocyanate in the presence of an appropriate accelerator.

Epoxy resin oligomers may be prepared by condensation of an epoxy resin with a phenol such as a bisphenol. A typical example is the condensation of bisphenol A with a bisphenol A diglycidyl ether to produce an oligomeric diglycidyl ether. In another example a phenol dissimilar to the one used to derive the epoxy resin may be used. For example tetrabromobisphenol A may be condensed with bisphenol A diglycidyl ether to produce an oligomeric diglycidyl ether containing halogens.

Further suitable polyepoxide compounds as well as curing agents for epoxy resins are described in Henry Lee and Kris Neville, "Handbook of Epoxy Resins" McGraw-Hill Book Company, 1967, and Henry Lee "Epoxy Resins", American Chemical Society, 1970.

The epoxy resin may be a solid at room temperature. Thus, in some embodiments, the epoxy resin has a softening point of 25° C. to about 150° C. Softening points may be determined according to ASTM E28-99 (2004), "Standard Test Methods for Softening Point of Resins Derived from Naval Stores by Ring-and-Ball Apparatus". The epoxy resin may be a liquid or a softened solid at room temperature. Thus, in some embodiments, the epoxy resin has a softening point less than 25° C.

In addition to the epoxy resin, the curable composition comprises a polyfunctional poly(arylene ether). For the purposes of this application and in reference to a poly(arylene ether), "functionality" refers to terminal phenolic hydroxy groups. With respect to an individual poly(arylene ether) molecule, the term "polyfunctional" means that the molecule comprises at least two phenolic hydroxy groups. With respect to an individual poly(arylene ether) molecule, the term "bifunctional" means that the molecule comprises two phenolic hydroxy groups. With respect to a poly(arylene ether) resin, the term "polyfunctional" means that the resin comprises, on average, at least 1.5 phenolic hydroxy groups per poly(arylene ether) molecule. With respect to a poly(arylene ether) resin, the term "bifunctional" means that the resin comprises, on average, about 1.6 to about 2.4 phenolic hydroxy groups per poly(arylene ether) molecule. In some embodiments, the bifunctional poly(arylene ether) comprises, on average, about 1.8 to about 2.2 phenolic hydroxy groups per poly(arylene ether) molecule.

The polyfunctional poly(arylene ether) has a polydispersity index less than or equal to 2.2, specifically less than or equal to 2.15, more specifically less than or equal to 2.10. In some embodiments, the polydispersity index is at least 2, specifically at least 2.05. As used herein the term "polydispersity index" refers to the ratio of weight average molecular weight to number average molecular weight. In equation form, $$PDI=M_w/M_n$$

where PDI is the polydispersity index, $M_w$ is the weight average molecular weight, and $M_n$ is the number average molecular weight. Weight average molecular weight and number average molecular weight may be determined by gel permeation chromatography (GPC) using polystyrene standards. For example, the chromatographic system may consist of an Agilent Series 1100 system, including isocratic pump, autosampler, thermostatted column compartment, and multi-wavelength detector. The elution solvent may be chloroform with 50 parts per million by weight of di-n-butylamine. Sample solutions may be prepared by dissolving 0.01 gram of sample in 20 milliliters chloroform with toluene (0.25 milliliter per liter) as an internal marker. The sample solutions may be filtered through a Gelman 0.45 micrometer syringe filter before GPC analysis. The injection volume may be 50 microliters and the eluent flow rate may be 1 milliliter/minute. Two Polymer Laboratories GPC columns (Phenogel 5 micron linear(2), 300×7.80 millimeters) connected in series may be used for separation of the sample. The detection wavelength may be 280 nanometers. The data may be acquired and processed using an Agilent ChemStation with integrated GPC data analysis software. The molecular weight distribution results may be calibrated with polystyrene standards. The weight average and number average molecular weight values are reported without any correction.

In some embodiments, about 0.25 to about 3 weight percent of the polyfunctional poly(arylene ether) consists of molecules having a molecular weight less than or equal to 300 atomic mass units. In some embodiments, about 0.5 to about 5 weight percent of the polyfunctional poly(arylene ether) consists of molecules having a molecular weight less than or equal to 500 atomic mass units.

In some embodiments, the polyfunctional poly(arylene ether) is a bifunctional poly(arylene ether) having the structure

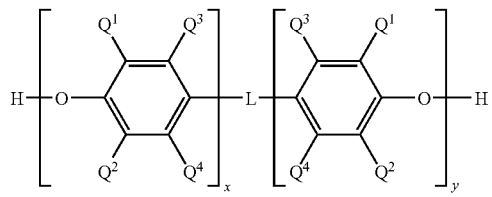

wherein $Q^1$ and $Q^2$ are identical within each phenylene ether unit and selected from the group consisting of halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; each occurrence of $Q^3$ and $Q^4$ is independently selected from the group consisting of hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; x and y are independently 0 to about 30, specifically 0 to about 20, more specifically 0 to about 15, still more specifically 0 to about 10, even more specifically 0 to about 8, with the proviso that the sum of x and y is at least 2, specifically at least 3, more specifically at least 4; and L has the structure

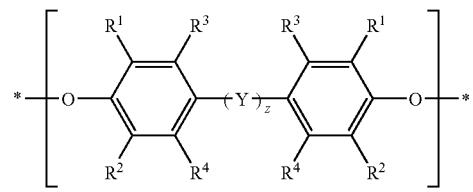

wherein each occurrence of $R^1$ and $R^2$ and $R^3$ and $R^4$ is independently selected from the group consisting of hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; z is 0 or 1; and Y has a structure selected from the group consisting of

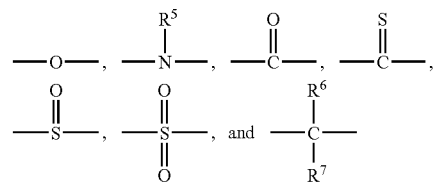

wherein each occurrence of $R^5$ is independently selected from the group consisting of hydrogen and $C_1$-$C_{12}$ hydrocarbyl, and each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group. As used herein, the term "hydrocarbyl", whether used by itself, or as a prefix, suffix, or fragment of another term, refers to a residue that contains only carbon and hydrogen. The residue may be aliphatic or aromatic, straight-chain, cyclic, bicyclic, branched, saturated, or unsaturated. It may also contain combinations of aliphatic, aromatic, straight chain, cyclic, bicyclic, branched, saturated, and unsaturated hydrocarbon moieties. The hydrocarbyl residue, when so stated however, may contain heteroatoms over and above the carbon and hydrogen members of the substituent residue. Thus, when specifically noted as containing such heteroatoms, the hydrocarbyl residue may also contain one or more carbonyl groups, amino groups, hydroxyl groups, or the like, or it may contain heteroatoms within the backbone of the hydrocarbyl residue. As one example, $Q^1$ may be a di-n-butylaminomethyl group formed by reaction of a terminal 3,5-dimethyl-1,4-phenyl group with the di-n-butylamine component of an oxidative polymerization catalyst. In some embodiments, each occurrence of $Q^1$ and $Q^2$ is methyl, each occurrence of $Q^3$ is hydrogen, each occurrence of $Q^4$ is hydrogen or methyl, the sum of x and y is 2 to about 15, each occurrence of $R^1$ and $R^2$ and $R^3$ and $R^4$ is independently hydrogen or methyl, and Y has the structure

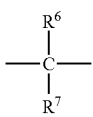

wherein each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

In the bifunctional poly(arylene ether) structure above, there are limitations on the variables x and y, which correspond to the number of phenylene ether repeating units at two different places in the bifunctional poly(arylene ether) molecule. In the structure, x and y are independently 0 to about 30, specifically 0 to about 20, more specifically 0 to about 15, even more specifically 0 to about 10, yet more specifically 0 to about 8. The sum of x and y is at least 2, specifically at least 3, more specifically at least 4. A particular polyfunctional poly(arylene ether) resin can be analyzed by proton nuclear magnetic resonance spectroscopy ($^1$H NMR) to determine whether these limitations are met for the entire resin, on average. Specifically, $^1$H NMR can distinguish between resonances for protons associated with internal and terminal phenylene ether groups, and internal and terminal residues of a polyhydric phenol, as well as other terminal residues. It is therefore possible to determine the average number of phenylene ether repeat units per molecule, and the relative abundance of internal and terminal residues derived from dihydric phenol.

In some embodiments, the polyfunctional poly(arylene ether) is a bifunctional poly(arylene ether) having the structure

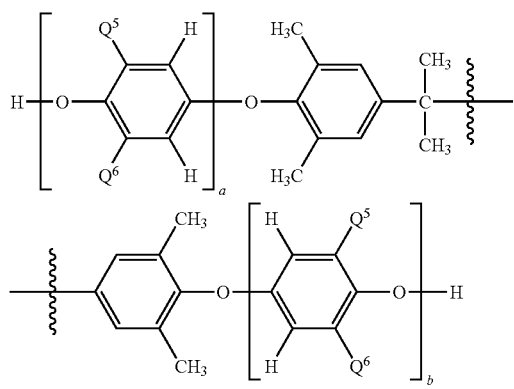

wherein each occurrence of $Q^5$ and $Q^6$ is independently methyl or di-n-butylaminomethyl; and each occurrence of a and b is independently 0 to about 20, with the proviso that the sum of a and b is at least 2, specifically at least 3, more specifically at least 4. Bifunctional poly(arylene ether)s having this structure can be synthesized by oxidative copolymerization of 2,6-xylenol and 2,2-bis(3,5-dimethyl-4-hydroxyphenyl)propane in the presence of a catalyst comprising di-n-butylamine.

Any of the above-described polyfunctional poly(arylene ether)s may contain minor amounts of structural units formed as a result of side reactions occurring during poly(arylene ether) synthesis or processing. For example, when a polyfunctional poly(arylene ether) is prepared by method comprising oxidative polymerization of monomers comprising 2,6-dimethylphenol in the presence of a secondary amine, thermal decomposition may generate minor amounts of the structural units

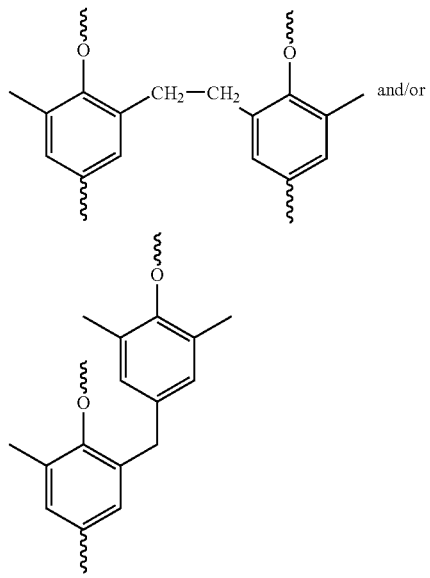

wherein the wavy bonds represent connections to the remainder of the polyfunctional poly(arylene ether) molecule.

The polyfunctional poly(arylene ether) has an intrinsic viscosity of about 0.03 to 0.2 deciliter per gram measured in chloroform at 25° C., specifically about 0.03 to about 0.12 deciliter per gram, more specifically about 0.03 to about 0.09 deciliter per gram, even more specifically about 0.03 to about 0.06 deciliter per gram.

In some embodiments, the polyfunctional poly(arylene ether) has a number average molecular weight less than or equal to 900 atomic mass units, specifically less than or equal to 800 atomic mass units. In some embodiments, the number average molecular weight is greater than or equal to 400 atomic mass units, or greater than or equal to 520 atomic mass units, or greater than or equal to 640 atomic mass units.

Polyfunctional poly(arylene ether)s having the specified polydispersity index and intrinsic viscosity can be prepared, for example, by oxidative copolymerization of a monohydric phenol and a polyhydric phenol. Suitable monohydric phenols include, for example, 2,6-dimethylphenol, 2,3,6-trimethylphenol, and the like, and mixtures thereof. Suitable polyhydric phenols include, for example, 3,3',5,5'-tetramethyl-4,4'-biphenol, 2,2-bis(3-methyl-4-hydroxyphenyl)propane, 2,2-bis(3,5-dimethyl-4-hydroxyphenyl)propane, 1,1-bis(4-hydroxyphenyl)methane, 1,1-bis(4-hydroxyphenyl)ethane, 2,2-bis(4-hydroxyphenyl)propane 2,2-bis(4-hydroxyphenyl)butane, 2,2-bis(4-hydroxyphenyl)octane, 1,1-bis(4-hydroxyphenyl)propane, 1,1-bis(4-hydroxyphenyl)-n-butane, bis(4-hydroxyphenyl)phenylmethane, 1,1-bis(4-hydroxy-3-methylphenyl)cyclohexane, 1,1-bis(4-hydroxy-3,5-dimethylphenyl)cyclopentane, 1,1-bis(4-hydroxy-3,5-dimethylphenyl)cyclohexane, 1,1-bis(4-hydroxy-3-methylphenyl)cycloheptane, 1,1-bis(4-hydroxy-3,5-dimethylphenyl)cycloheptane, 1,1-bis(4-hydroxy-3-methylphenyl)cyclooctane, 1,1-bis(4-hydroxy-3,5-dimethylphenyl)cyclooctane, 1,1-bis(4-hydroxy-3-methylphenyl)cyclononane, 1,1-bis(4-hydroxy-3,5-dimethylphenyl)cyclononane, 1,1-bis(4-hydroxy-3-methylphenyl)cyclodecane, 1,1-bis(4-hydroxy-3,5- dimethylphenyl)cyclodecane, 1,1-bis(4-hydroxy-3-methylphenyl)cycloundecane, 1,1-bis(4-hydroxy-3,5-dimethylphenyl)cycloundecane, 1,1-bis(4-hydroxy-3-methylphenyl)cyclododecane, 1,1-bis(4-hydroxy-3,5-dimethylphenyl)cyclododecane, 1,1-bis(4-hydroxy-3-t-butylphenyl)propane, 2,2-bis(4-hydroxy-2,6-dimethylphenyl)propane 2,2-bis(4-hydroxy-3-bromophenyl)propane, 1,1-bis(4-hydroxyphenyl)cyclopentane, 1,1-bis(4-hydroxyphenyl)cyclohexane, 1,1,1-tris(3,5-dimethyl-4-hydroxyphenyl)ethane 1,1,1-tris(3-methyl-4-hydroxyphenyl)ethane, 1,3,5-tris(3,5-dimethyl-4-hydroxyphenyl-1-keto)benzene, 1,3,5-tris(3,5-dimethyl-4-hydroxyphenyl-1-isopropylidene)benzene, 2,2,4,4-tetrakis(3-methyl-4-hydroxyphenyl)pentane, 2,2,4,4-tetrakis(3,5-dimethyl-4-hydroxyphenyl)pentane, 1,1,4,4-tetrakis(3-methyl-4-hydroxyphenyl)cyclohexane, 1,1,4,4-tetrakis(3,5-dimethyl-4-hydroxyphenyl)cyclohexane, 1,3,5-tris(3,5-dimethyl-4-hydroxyphenyl)benzene, 1,3,5-tris(3-methyl-4-hydroxyphenyl)benzene, 2,6-bis(2-hydroxy-5-methylbenzyl)-4-methylphenol, 4,6-dimethyl-2,4,6-tris(4-hydroxy-3-methylphenyl)-2-heptene, 4,6-dimethyl-2,4,6-tris(4-hydroxy-3,5-dimethylphenyl)-2-heptene, 4,6-dimethyl-2,4,6-tris(4-hydroxy-3-methylphenyl)heptane, 4,6-dimethyl-2,4,6-tris(4-hydroxy-3-methylphenyl)heptane, 2,4-bis(4-hydroxy-3-methylphenylisopropyl)phenol, 2,4-bis(4-hydroxy-3,5-dimethylphenylisopropyl)phenol, tetrakis(4-hydroxy-3-methylphenyl)methane, tetrakis(4-hydroxy-3,5-dimethylphenyl)methane, tetrakis(4-[4-hydroxy-3-methylphenylisopropyl]-phenoxy)methane, tetrakis(4-[4-hydroxy-3,5-dimethylphenylisopropyl]-phenoxy)methane, and mixtures thereof. In some embodiments, the polyhydric phenol comprises 3 to 8 phenolic hydroxy groups per molecule. In some embodiments, the polyfunctional poly(arylene ether) is a bifunctional poly(arylene ether) prepared by oxidative copolymerization of 2,6-dimethylphenol and 2,2-bis(3,5-dimethyl-4-hydroxyphenyl)propane. An illustrative initial reaction mixture composition for oxidative copolymerization of 2,6-dimethylphenol and 2,2-bis(3,5-dimethyl-4-hydroxyphenyl)propane is as follows: 50192 parts by weight of 2,6-dimethylphenol, 109581 parts by weight of toluene, 503 parts by weight of di-n-butylamine, 1175 parts by weight of dimethyl-n-butylamine, 264 parts by weight of a diamine mix containing N,N'-dibutylethylenediamine and didecyl dimethyl ammonium chloride, and 353 parts by weight of a catalyst mix containing 6.5 weight percent $Cu_2O$ in aqueous hydrogen bromide. The polymerization reaction is conducted by controlling the temperature and oxygen concentration in the reaction vessel. The concentration of copper in the polymerization reaction mixture is about 125 parts per million by weight based on the total weight of the reaction mixture, or about 420 parts per million by weight based on the weight of poly(arylene ether) product. The concentration of poly(arylene ether) product in the polymerization reaction mixture is 29.8 weight percent based on the total weight of the reaction mixture. The product bifunctional poly(arylene ether) has an intrinsic viscosity of 0.06 deciliter per gram measured in chloroform at 25° C.

The polyfunctional poly(arylene ether) can also be prepared by a process comprising oxidatively polymerizing a monohydric phenol in the presence of a catalyst under conditions suitable to form a corresponding poly(arylene ether) and a corresponding diphenoquinone; separating the poly(arylene ether) and the diphenoquinone from the catalyst; and equilibrating the poly(arylene ether) and the diphenoquinone to form a poly(arylene ether) having two terminal hydroxy groups. An illustrative example of a corresponding poly(arylene ether) is poly(2,6-dimethyl-1,4-phenylene ether) prepared from oxidative polymerization of 2,6-dimethylphenol. An illustrative example of a corresponding diphenoquinone is 3,3',5,5'-tetramethyl-4,4'-diphenoquinone formed by oxidation of 2,6-dimethylphenol. When this preparation method is used, it may be necessary to purify the bifunctional poly(arylene ether) to achieve a polydispersity index less than 2.2.

The polyfunctional poly(arylene ether) can also be prepared by a so-called redistribution reaction in which a monofunctional poly(arylene ether) is equilibrated with a polyhydric phenol, optionally in the presence of an oxidizing agent. Redistribution reactions are known in the art and described, for example, in U.S. Pat. Nos. 3,496,236 to Cooper et al. and 5,880,221 to Liska et al. When this preparation method is used, it may be necessary to purify the polyfunctional poly(arylene ether) to achieve a polydispersity index less than 2.2.

The composition comprises about 10 to about 60 parts by weight of the polyfunctional poly(arylene ether), based on 100 parts by weight total of the epoxy resin and the polyfunctional poly(arylene ether). Specifically, the polyfunctional poly(arylene ether) amount may be about 20 to about 50 parts by weight, or about 30 to about 50 parts by weight, or about 40 to about 50 parts by weight.

In addition to the epoxy resin and the polyfunctional poly(arylene ether), the curable composition comprises a solvent. The solvent has an atmospheric boiling point of about 50 to about 250° C. A boiling point in this range facilitates removal of solvent from the curable composition while minimizing or eliminating the effects of bubbling during solvent removal. The solvent promotes formation of a homogeneous resin mixture, which in turn provides wet-out and adhesion to the glass reinforcement of the prepreg. The addition of bifunctional poly (arylene ether) increases the viscosity of the epoxy resin system, enabling restricted flowability of resin at higher temperatures, which is optimal for the lamination process.

The solvent can be, for example, a $C_3$-$C_8$ ketone, a $C_4$-$C_8$ N,N-dialkylamide, a $C_4$-$C_{16}$ dialkyl ether, a $C_6$-$C_{12}$ aromatic hydrocarbon, a $C_1$-$C_3$ chlorinated hydrocarbon, a $C_3$-$C_6$ alkyl alkanoate, a $C_2$-$C_6$ alkyl cyanide, or a mixture thereof. The carbon number ranges refer to the total number of carbon atoms in the solvent molecule. For example, a $C_4$-$C_{16}$ dialkyl ether has 4 to 16 total carbon atoms, and the two alkyl groups can be the same or different. As another example, the 2 to 6 carbons in the "$C_2$-$C_6$ alkyl cyanides" include the carbon atom in the cyanide group. Specific ketone solvents include, for example, acetone, methyl ethyl ketone, methyl isobutyl ketone, and mixtures thereof. Specific $C_4$-$C_8$ N,N-dialkylamide solvents include, for example, dimethylformamide, dimethylacetamide, N-methyl-2-pyrrolidone (Chemical Abstracts Service Registry No. 872-50-4), and the like, and mixtures thereof. Specific dialkyl ether solvents include, for example, tetrahydrofuran, ethylene glycol monomethylether, dioxane, and the like, and mixtures thereof. In some embodiments, the $C_4$-$C_{16}$ dialkyl ethers include cyclic ethers such as tetrahydrofuran and dioxane. In some embodiments, the $C_4$-$C_{16}$ dialkyl ethers are noncyclic. The dialkyl ether may, optionally, further include one or more ether oxygen atoms within the alkyl groups and one or more hydroxy group substituents on the alkyl groups. The aromatic hydrocarbon solvent may or may not comprise an ethylenically unsaturated solvent. Specific aromatic hydrocarbon solvents include, for example, benzene, toluene, xylenes, styrene, divinylbenzenes, and the like, and mixtures thereof. The aromatic hydrocarbon solvent is preferably unhalogenated. That is, it does not include any fluorine, chlorine, bromine, or iodine atoms. Specific $C_3$-$C_6$ alkyl alkanoates include, for example, methyl acetate, ethyl acetate, methyl propionate, ethyl propionate, and the like, and mixtures thereof. Specific $C_2$-$C_6$ alkyl cyanides include, for example, acetonitrile, propionitrile, butyronitrile, and mixtures thereof. In some embodiments, the solvent is acetone. In some embodiments, the solvent is methyl ethyl ketone. In some embodiments, the solvent is methyl isobutyl ketone. In some embodiments, the solvent is N-methyl-2-pyrrolidone. In some embodiments, the solvent is ethylene glycol monomethyl ether.

The composition comprises at about 2 to about 100 parts by weight of the solvent, based on 100 parts by weight total of the epoxy resin and the polyfunctional poly(arylene ether). Specifically, the solvent amount can be about 5 to about 80 parts by weight, more specifically about 10 to about 60 parts by weight, even more specifically about 20 to about 40 parts by weight. The solvent may be chosen, in part, to adjust the viscosity of the curable composition. Thus, the solvent amount may depend on variables including the type and amount of epoxy resin, the type and amount of polyfunctional poly(arylene ether), and the processing temperature used for impregnation of the reinforcing structure with the curable composition.

In addition to the epoxy resin, the polyfunctional poly(arylene ether), and the solvent, the curable composition comprises an amount of a curing promoter effective to cure the epoxy resin. The term "curing promoter" as used herein encompasses compounds whose roles in curing epoxy resins are variously described as those of a hardener, a hardening accelerator, a curing catalyst, and a curing co-catalyst, among others. Suitable curing promoters for epoxy resins are known in the art and include, for example, latent cationic cure catalysts, phenolic hardeners, amine compounds, anhydrides, copper (II) salts of aliphatic or aromatic carboxylic acids, aluminum (III) salts of aliphatic or aromatic carboxylic acids, copper (II) β-diketonates, aluminum (III) β-diketonates, borontrifluoride-trialkylamine complexes, and mixtures thereof.

The curing promoter may comprise a latent cationic cure catalyst. Latent cationic cure catalysts include, for example, diaryliodonium salts, phosphonic acid esters, sulfonic acid esters, carboxylic acid esters, phosphonic ylides, benzylsulfonium salts, benzylpyridinium salts, benzylammonium salts, isoxazolium salts, and combinations thereof. For example, the curing promoter may be a latent cationic cure catalyst comprising a diaryliodonium salt having the structure

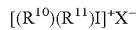

wherein $R^{10}$ and $R^{11}$ are each independently a $C_6$-$C_{14}$ monovalent aromatic hydrocarbon radical, optionally substituted with from 1 to 4 monovalent radicals selected from $C_1$-$C_{20}$ alkyl, $C_1$-$C_{20}$ alkoxy, nitro, and chloro; and wherein $X^-$ is an anion. In some embodiments, the curing promoter is a latent cationic cure catalyst comprising a diaryliodonium salt having the structure)

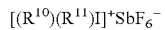

wherein $R^{10}$ and $R^{11}$ are each independently a $C_6$-$C_{14}$ monovalent aromatic hydrocarbon radical, optionally substituted with from 1 to 4 monovalent radicals selected from $C_1$-$C_{20}$ alkyl, $C_1$-$C_{20}$ alkoxy, nitro, and chloro. In some embodiments, the curing promoter is a latent cationic cure catalyst comprising 4-octyloxyphenyl phenyl iodonium hexafluoroantimonate.

The curing promoter may comprise a phenolic hardener. Suitable phenolic hardeners include, for example, novolac type phenol resins, aralkyl type phenol resins, dicyclopentadiene type phenol resins, terpene modified phenol resins, biphenyl type phenol resins, bisphenols, triphenylmethane type phenol resins, and the like, and mixtures thereof. It will be understood that the polyfunctional poly(arylene ether) may function as a phenolic hardener. However, the curable composition comprises a curing promoter that is not the polyfunctional poly(arylene ether).

The curing promoter may comprise an amine compound. Examples of suitable amine compounds include amine hardeners such as isophoronediamine, triethylenetetraamine, diethylenetriamine, aminoethylpiperazine, 1,2- and 1,3-diaminopropane, 2,2-dimethylpropylenediamine, 1,4-diaminobutane, 1,6-diaminohexane, 1,7-diaminoheptane, 1,8-diaminooctane, 1,9-diaminononane, 1,12-diaminododecane, 4-azaheptamethylenediamine, N,N'-bis(3-aminopropyl)butane-1,4-diamine, cyclohexanediamine, dicyandiamine, diamide diphenylmethane, diamide diphenylsulfonic acid (amine adduct), 4,4'-methylenedianiline, diethyltoluenediamine, m-phenylene diamine, melamine formaldehyde, tetraethylenepentamine, 3-diethylaminopropylamine, 3,3'-iminobispropylamine, 2,4-bis(p-aminobenzyl)aniline, tetraethylenepentamine, 3-diethylaminopropylamine, 2,2,4- and 2,4,4-trimethylhexamethylenediamine, 1,2- and 1,3-diaminocyclohexane, 1,4-diamino-3,6-diethylcyclohexane, 1,2-diamino-4-ethylcyclohexane, 1,4-diamino-3,6-diethylcyclohexane, 1-cyclohexyl-3,4-diminocyclohexane, 4,4'-diaminondicyclohexylmethane, 4,4'-diaminodicyclohexylpropane, 2,2-bis(4-aminocyclohexyl)propane, 3,3'-dimethyl-4,4'-diamiondicyclohexylmethane, 3-amino-1-cyclohexaneaminopropane, 1,3- and 1,4-bis(aminomethyl)cyclohexane, m- and p-xylylenediamine, diethyl toluene diamines, and mixtures thereof. Examples of suitable amine compounds further include tertiary amine hardening accelerators such as triethylamine, tributylamine, dimethylaniline, diethylaniline, α-methylbenzyldimethylamine, N,N-dimethylaminoethanol, N,N-dimethylaminocresol, tri(N,N-dimethylaminomethyl)phenol, and the like, and mixtures thereof. Examples of suitable amine compounds further include imidazole hardening accelerators such as 2-methylimidazole, 2-ethylimidazole, 2-laurylimidazole, 2-heptadecylimidazole, 2-phenylimidazole, 4-methylimidazole, 4-ethylimidazole, 4-laurylimidazole, 4-heptadecylimidazole, 2-phenyl-4-methylimidazole, 2-phenyl-4-hydroxymethylimidazole, 2-ethyl-4-methylimidazole, 2-ethyl-4-hydroxymethylimidazole, 1-cyanoethyl-4-methylimidazole, 2-phenyl-4,5-dihydroxymethylimidazole, and the like, and mixtures thereof.

The curing promoter may comprise an anhydride. Examples of suitable anhydrides include maleic anhydride (MA), phthalic anhydride (PA), hexahydro-o-phthalic anhydride (HEPA), tetrahydrophthalic anhydride (THPA), pyromellitic dianhydride (PMDA), trimellitic anhydride (TMA), cycloaliphatic carboxylic acid anhydrides (such as cyclohexane-1,2-dicarboxylic anhydride), and the like, and mixtures thereof.

The curing promoter may comprise a copper (II) or aluminum (III) salt of an aliphatic or aromatic carboxylic acid. Suitable examples of such salts include the copper (II) and aluminum (III) salts of acetate, stearate, gluconate, citrate, benzoate, and like anions, as well as mixtures thereof.

The curing promoter may comprise a copper (II) or aluminum (III) β-diketonate. Suitable examples of such metal diketonates include the copper (II) and aluminum (III) salts of acetylacetonate.

The curing promoter may comprise a borontrifluoride-trialkylamine complex. An illustrative borontrifluoride-trialkylamine complex is borontrifluoride-trimethylamine complex.

The amount of curing promoter will depend on the type of curing promoter, as well as the identities and amounts of the other resin components. For example, when the curing promoter is a latent cationic cure catalyst, it may be used in an amount of about 0.1 to about 10 parts by weight per 100 parts by weight total of the epoxy resin and the polyfunctional poly(arylene ether). As another example, when the curing promoter is a copper (II) or aluminum (III) beta-diketonate, it may be used in an amount of about 1 to 10 parts by weight per 100 parts by weight of the epoxy resin and the polyfunctional poly(arylene ether). As yet another example, when the curing promoter is an amine hardener, it may be used in an amount of about 2 to about 40 parts by weight, per 100 parts by weight of the epoxy resin and the polyfunctional poly(arylene ether). As yet another example, when the curing promoter is an imidazole hardening accelerator, it may be used in an amount of about 0.01 to about 5 parts by weight, per 100 parts by weight of the epoxy resin and the polyfunctional poly(arylene ether).

The composition may, optionally, further comprise one or more additives. Suitable additives include, for example, dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof.

In some embodiments, the curable composition comprises about 40 to about 70 parts by weight of the epoxy resin, about 30 to about 60 parts by weight of the polyfunctional poly(arylene ether), and about 10 to about 60 parts by weight of the solvent.

In some embodiments, the curable composition further comprises a monofunctional poly(arylene ether). With respect to an individual poly(arylene ether) molecule, the term "monofunctional" means that the molecule comprises one phenolic hydroxy group. With respect to a poly(arylene ether) resin, the term "monofunctional" means that the resin comprises, on average, about 0.5 to less than 1.5 phenolic hydroxy groups per poly(arylene ether) molecule. When a monofunctional poly(arylene ether) is present in the curable composition, the polyfunctional poly(arylene ether) and the monofunctional poly(arylene ether) are present in a weight ratio of at least 0.7 to 1, specifically at least 1 to 1, more specifically at least 1.5 to 1, still more specifically at least 2 to 1. In some embodiments, the monofunctional poly(arylene ether) has an intrinsic viscosity of about 0.05 to about 0.5 deciliter per gram, specifically about 0.06 to about 0.4 deciliter per gram, more specifically about 0.08 to about 0.35 deciliter per gram, all as measured in chloroform at 25° C.

In some embodiments, the curable composition is substantially free of any polymer other than the epoxy resin and the polyfunctional poly(arylene ether). In this context, "substantially free" means that the curable composition comprises less than 1 weight percent, specifically less than 0.1 weight percent, of any polymer other than the epoxy resin and the polyfunctional poly(arylene ether).

One embodiment is a method of forming a composite, comprising: impregnating a reinforcing structure with a curable composition at a temperature of about 10 to about 40° C., wherein the curable composition consists of about 30 to about 80 parts by weight of an epoxy resin, about 20 to about 60 parts by weight of a polyfunctional poly(arylene ether) having a polydispersity index less than or equal to 2.2 and an intrinsic viscosity of about 0.03 to about 0.2 deciliter per gram measured in chloroform at 25° C., about 2 to about 100 parts by weight of a solvent having an atmospheric boiling point of about 50 to about 250° C., an amount of a curing promoter effective to cure the epoxy resin, and, optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof; wherein all parts by weight are based on 100 parts by weight total of the epoxy resin and the polyfunctional poly(arylene ether). In some embodiments, the polydispersity index of the polyfunctional poly(arylene ether) is about 2 to 2.2.

One embodiment is a method of forming a composite, comprising: impregnating a reinforcing structure with a curable composition at a temperature of about 15 to about 30° C., wherein the curable composition comprises about 40 to about 70 parts by weight of bisphenol A diglycidyl ether epoxy resin, about 30 to about 60 parts by weight of a bifunctional poly(arylene ether) having a polydispersity index less than or equal to 2.2 and an intrinsic viscosity of about 0.06 to about 0.12 deciliter per gram measured in chloroform at 25° C., wherein the bifunctional poly(arylene ether) has the structure

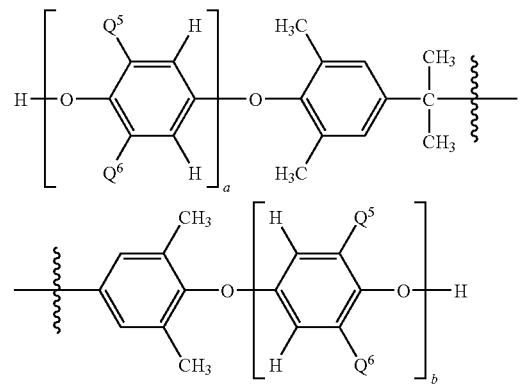

wherein each occurrence of $Q^5$ and $Q^6$ is independently methyl or di-n-butylaminomethyl, and each occurrence of a and b is independently 0 to about 20, with the proviso that the sum of a and b is at least 2, about 10 to about 60 parts by weight of a solvent selected from the group consisting of toluene, methyl ethyl ketone, and mixtures thereof; about 4 to about 12 parts by weight of diethyl toluene diamine, and about 0.05 to about 1 parts by weight of 2-ethyl-4-methylimidazole; wherein all parts by weight are based on 100 parts by weight total of the epoxy resin and the bifunctional poly(arylene ether); and partially curing the curable composition. In some embodiments, the polydispersity index of the bifunctional poly(arylene ether) is about 2 to 2.2.

One embodiment is a method of forming a composite, comprising: impregnating a reinforcing structure with a curable composition at a temperature of about 15 to about 30° C., wherein the curable composition consists of about 40 to about 70 parts by weight of bisphenol A diglycidyl ether epoxy resin, about 30 to about 60 parts by weight of a bifunctional poly(arylene ether) having a polydispersity index less than or equal to 2.2 and an intrinsic viscosity of about 0.06 to about 0.12 deciliter per gram measured in chloroform at 25° C., wherein the bifunctional poly(arylene ether) has the structure

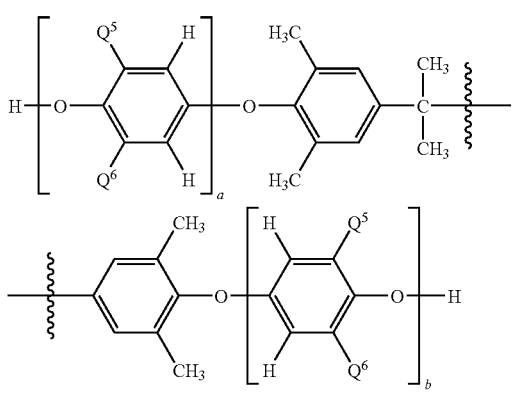

wherein each occurrence of $Q^5$ and $Q^6$ is independently methyl or di-n-butylaminomethyl, and each occurrence of a and b is independently 0 to about 20, with the proviso that the sum of a and b is at least 2, about 10 to about 60 parts by weight of a solvent selected from the group consisting of toluene, methyl ethyl ketone, and mixtures thereof; about 4 to about 12 parts by weight of diethyl toluene diamine, about 0.05 to about 1 parts by weight of 2-ethyl-4-methylimidazole, and, optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof; wherein all parts by weight are based on 100 parts by weight total of the epoxy resin and the bifunctional poly(arylene ether); and partially curing the curable composition. In some embodiments, the polydispersity index of the bifunctional poly(arylene ether) is about 2 to 2.2.

The method comprises partially curing the curable composition after the reinforcing structure has been impregnated with it. Partial curing is curing sufficient to reduce or eliminate the wetness and tackiness of the curable composition but not so great as to fully cure the composition. The resin in a prepreg is customarily in the partially cured state, and those skilled in the thermoset arts, and particularly the reinforced composite arts, understand the concept of partial curing and how to determine conditions to partially cure a resin without undue experimentation. References herein to properties of the "cured composition" or the "composition after curing" generally refer to compositions that are substantially fully cured. For example, the resin in a laminate formed from prepregs is typically substantially fully cured. One skilled in the thermoset arts may determine whether a sample is partially cured or substantially fully cured without undue experimentation. For example, one may analyze a sample by differential scanning calorimetry to look for an exotherm indicative of additional curing occurring during the analysis. A sample that is partially cured will exhibit an exotherm. A sample that is substantially fully cured will exhibit little or no exotherm. A lab-scale method of partially curing the curable composition is described in the working examples below, where partial curing is effected by subjecting the curable-composition-impregnated reinforcing structure to a temperature of about 133 to about 140° C. for about 4 to about 10 minutes.

Commercial-scale methods of forming composites are known in the art, and the curable compositions described herein are readily adaptable to existing processes and equipment. For example, prepregs are often produced on treaters. The main components of a treater include feeder rollers, a resin impregnation tank, a treater oven, and receiver rollers. The reinforcing structure (E-glass, for example) is usually rolled into a large spool. The spool is then put on the feeder rollers that turn and slowly roll out the reinforcing structure. The reinforcing structure then moves through the resin impregnation tank, which contains the curable composition. The varnish impregnates the reinforcing structure. After emerging from the tank, the coated reinforcing structure moves upward through the vertical treater oven, which is typically at a temperature of about 175 to about 200° C., and the solvent of the varnish is boiled away. The resin begins to polymerize at this time. When the composite comes out of the tower it is sufficiently cured so that the web is not wet or tacky. The cure process, however, is stopped short of completion so that additional curing can occur when laminate is made. The web then rolls the prepreg onto a receiver roll.

While the above-described curing methods rely on thermal curing, it is also possible to effect curing with radiation, including ultraviolet light and electron beams. Combinations of thermal curing and radiation curing may also be used.

Other embodiments include composites formed by any of the above-described methods. One embodiment is a composite prepared by one of the above-described methods and exhibiting one or more of a water absorption less than or equal to 0.2 weight percent after 24 hours immersion in water at 23° C.; a methylene chloride absorption less than or equal to 1.3 weight percent after 30 minutes immersion in methylene chloride at 23° C. followed by 10 minutes in air at 23° C.; a dielectric constant less than or equal to 3.4 measured at 23° C. and 2.4 gigahertz; and a dissipation factor less than or equal to 0.015 measured at 23° C. and 2.4 gigahertz. Procedures for determining water absorptions, methylene chloride absorptions, dielectric constants, and dissipation factors are found in the working examples below. In some embodiments, the water absorption is less than or equal to 0.1 weight percent, specifically less than or equal to 0.05 weight percent. In some embodiments, the methylene chloride absorption is less than or equal to 1 weight percent, specifically less than or equal to 0.8 weight percent, more specifically less than or equal to 0.7 weight percent. In some embodiments, the dielectric constant is less than or equal to 3.3, specifically less than or equal to 3.2, more specifically less than or equal to 3.1. In some embodiments, the dissipation factor is less than or equal to 0.01, specifically less than or equal to 0.005.

One embodiment is a printed circuit board, comprising: a composite formed by a method comprising laminating a plurality of prepregs; wherein the prepregs are formed by a method comprising impregnating a reinforcing fabric with a curable composition at a temperature of about 10 to about 40° C.; wherein the curable composition comprises about 30 to about 80 parts by weight of an epoxy resin, about 20 to about 60 parts by weight of a bifunctional poly(arylene ether) having a polydispersity index less than or equal to 2.2 and an intrinsic viscosity of about 0.03 to about 0.2 deciliter per gram measured in chloroform at 25° C., about 2 to about 100 parts by weight of a solvent having an atmospheric boiling point of about 50 to about 250° C., and an amount of a curing promoter effective to cure the epoxy resin; wherein all parts by weight are based on 100 parts by weight total of the epoxy resin and the bifunctional poly(arylene ether). In some embodiments, laminating the plurality of prepregs comprises exposing the plurality of prepregs to a temperature of about 175 to about 205° C. and a pressure of about 17 to about 23 megapascals, and further exposing the plurality of prepregs to a temperature of about 185 to about 215° C. and a pressure of about 32 to about 40 megapascals. In some embodiments, the polydispersity index of the bifunctional poly(arylene ether) is about 2 to 2.2. Methods of forming circuit boards that include a prepreg lamination step are known in the art and are described in, for example, U.S. Pat. Nos. 5,582,872 to Prinz and 5,622,588 to Weber.

One embodiment is a printed circuit board, comprising: a composite formed by a method comprising laminating a plurality of prepregs; wherein the prepregs are formed by a method comprising impregnating a reinforcing fabric with a curable composition at a temperature of about 10 to about 40° C.; wherein the curable composition consists of about 30 to about 80 parts by weight of an epoxy resin, about 20 to about 60 parts by weight of a bifunctional poly(arylene ether) having a polydispersity index less than or equal to 2.2 and an intrinsic viscosity of about 0.03 to about 0.2 deciliter per gram measured in chloroform at 25° C., about 2 to about 100 parts by weight of a solvent having an atmospheric boiling point of about 50 to about 250° C., an amount of a curing promoter effective to cure the epoxy resin, and, optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof; wherein all parts by weight are based on 100 parts by weight total of the epoxy resin and the bifunctional poly(arylene ether). In some embodiments, the polydispersity index of the bifunctional poly(arylene ether) is about 2 to 2.2.

The invention is further illustrated by the following non-limiting examples.

EXAMPLES 1-3, COMPARATIVE EXAMPLES 1 AND 2

The following examples illustrate the ability to prepare curable compositions and impregnate a reinforcing structure with them, all without heating the compositions above 40° C. The examples also demonstrate improved properties in the resulting cured compositions and laminates comprising them.

The epoxy resin was a low-viscosity bisphenol A diglycidyl ether resin with an aromatic monofunctional reactive diluent, obtained from the Dow Chemical Company as D.E.R. 321. D.E.R. 321 is a reaction product of epichlorohydrin and bisphenol A. Based on information from the manufacturer, the "aromatic monofunctional reactive diluent" is believed to be ortho-cresyl glycidyl ether (CAS Reg. No. 026447-14-3). The poly(arylene ether)s were hydroxy-terminated with intrinsic viscosities ranging from 0.06 to 0.12 deciliter per gram, as measured in chloroform at 25° C. A monofunctional poly(2,6-dimethyl-1,4-phenylene ether) having an intrinsic viscosity of 0.12 deciliter per gram was obtained from GE Plastics as SA120 ("PPE, 0.12, monofxl." in Table 1). Bifunctional poly(arylene ether)s having intrinsic viscosities of 0.06, 0.09, and 0.12 deciliter per gram were prepared by oxidative copolymerization of 2,6-dimethylphenol and 2,2-bis(4-hydroxy-3,5-dimethylphenyl)propane ("PPE, 0.06, bifxl.", "PPE, 0.09, bifxl.", and "PPE, 0.12, bifxl.", respectively, in Table 1).

Five different poly(arylene ether)s were used in these experiments, and their properties are summarized in Table 1. Intrinsic viscosities were measured at 25° C. in chloroform on poly(arylene ether) samples that had been dried for 1 hour at 125° C. under vacuum. Values of number average molecular weight ($M_n$), weight average molecular weight ($M_w$), and polydispersity ($M_w/M_n$) were determined by gel permeation chromatography (GPC). The chromatographic system consisted of an Agilent Series 1100 system, including isocratic pump, autosampler, thermostatted column compartment, and multi-wavelength detector. The elution solvent was chloroform with 50 parts per million by weight of di-n-butylamine. Sample solutions were prepared by dissolving 0.01 gram of sample in 20 milliliters chloroform with toluene (0.25 milliliter per liter) as an internal marker. The sample solutions were filtered through a Gelman 0.45 micrometer syringe filter before GPC analysis; no additional sample preparation was performed. The injection volume was 50 microliters and the eluent flow rate was set at 1 milliliter/minute. Two Polymer Laboratories GPC columns (Phenogel 5 micron linear(2), 300×7.80 millimeters) connected in series were used for separation of the sample. The detection wavelength was set at 280 nanometers. The data were acquired and processed using an Agilent ChemStation with integrated GPC data analysis software. The molecular weight distribution results were calibrated with polystyrene standards. The results are reported without any correction as "$M_n$ (AMU)" and "$M_w$ (AMU)".

The poly(arylene ether) designated "PPE 0.12 monofxl." in Table 1 was a poly(2,6-dimethyl-1,4-phenylene ether) having an intrinsic viscosity of 0.12 deciliter per gram (dL/g) as measured at 25° C. in chloroform. It was prepared by oxidative polymerization of 2,6-dimethylphenol. The poly(arylene ether) designated "PPE 0.06 monofxl." in Table 1 was similar except that it had an intrinsic viscosity of 0.06 deciliter per gram. The poly(arylene ether) designated "PPE 0.12 bifxl." in Table 1 was an oxidative copolymer of 2,6-dimethylphenol and 2,2-bis(3,5-dimethyl-4-hydroxyphenyl)propane having an intrinsic viscosity of 0.12 deciliter per gram as measured at 25° C. in chloroform. The poly(arylene ether)s designated "PPE 0.09 bifxl." and "PPE 0.06 bifxl." were similar, except that they had intrinsic viscosities of 0.09 and 0.06 deciliter per gram, respectively.

TABLE 1

|  | PPE 0.12 monofxl. | PPE 0.12 bifxl. | PPE 0.09 bifxl. | PPE 0.06 monofxl. | PPE 0.06 bifxl. |
| --- | --- | --- | --- | --- | --- |
| Intrinsic viscosity (dL/g) | 0.12 | 0.12 | 0.09 | 0.06 | 0.06 |
| End group | OH | OH | OH | OH | OH |
| Functionality | Mono | Bi | Bi | Mono | Bi |
| $M_n$ (AMU) | 1964 | 1921 | 1198 | 886 | 799 |
| $M_w$ (AMU) | 5148 | 4378 | 2477 | 1873 | 1690 |
| $M_w/M_n$ | 2.62 | 2.28 | 2.07 | 2.11 | 2.12 |
| Tg (° C.) | 157.9 | 147.8 | 115.8 | 95.9 | 99.6 |
| Absolute $M_n$ | 2294 | 2747 | 1551 | 1133 | 1183 |

The curing promoter consisted of two components: the first was diethyl toluene diamine (an isomeric mixture including as major isomers 3,5-dimethyltoluene-2,4-diamine and 3,5-dimethyltoluene-2,6-diamine) purchased from Albemarle Corporation under the trade name Ethacure 100 ("Curing catalyst" in Table 2); and the second was 2-ethyl-4-methylimidazole obtained from Sigma-Aldrich ("Curing co-catalyst" in Table 2). Style 7628 fiberglass cloth having Finish 627, as manufactured by BGF Industries, Inc. was obtained from Northern Fiber Glass Sales.

For examples containing poly(arylene ether), the poly(arylene ether) was dissolved in the toluene at room temperature (about 23° C.). When the poly(arylene ether) was dissolved, epoxy resin was added, and the mixture was stirred overnight. Then, curing catalyst and co-catalyst were added to the resin solution at room temperature. The mixture was stirred until the catalysts were dissolved and was poured into a stainless steel pan. Square shaped glass cloths, with 14 centimeter (5.5 inch) sides, were immersed in the resin solution until each cloth was covered in resin. The cloths were then hung in a well-ventilated hood, and then in a vacuum oven at a temperature of 133 to 140° C. for 6 minutes. The prepregs were then laminated at 190° C. for one hour under a pressure of 20.7 megapascals (3,000 pounds per square inch), and at 199° C. for another hour under a pressure of 35.9 megapascals (5,200 pounds per square inch). When the bifunctional poly(arylene ether)s were used, good laminates were formed. When the monofunctional poly(arylene ether) was used, a good laminate was not formed (delamination occurred).

For samples without poly(arylene ether), the epoxy was dissolved in the toluene and mixed. The curing catalysts were then added to the epoxy solution.

Table 2 summarizes the components of the curable compositions. All component amounts are expressed in parts by weight.

Dielectric constant ("$D_k$") values and dissipation factor ("$D_f$") values were measured at 23° C. according to IPC-TM-650-2.5.5.9. Samples were rectangular prisms having dimensions 5 centimeters by 5 centimeters by 3.5 millimeters. Samples were conditioned at 23° C. and 50% relative humidity for a minimum of 24 hours before testing. The measuring cell was a Hewlett-Packard Impedance Material Analyzer model 4291B and had a width of 27.5 centimeters, a height of 9.5 centimeters, and a depth of 20.5 centimeters. The electrodes were Hewlett-Packard Model 16453A and had a diameter of 7 millimeters. Measurements were conducted using a capacitance method sweeping a range of frequency when DC voltage was applied to the dielectric materials. The applied voltage was 0.2 millivolt to 1 volt at the frequency range of 1 megahertz to 1 gigahertz. Table 2 provides values for dielectric constants and dissipation factors at a frequency of 2.4 gigahertz.

Prior to water absorption and methylene chloride absorption testing, samples were conditioned for 1 hour at 105-110° C. then cooled to 23° C. in a desiccator.

The absorption of methylene chloride ($CH_2Cl_2$) was determined by immersing a pre-weighed test sample having dimensions 5.08 centimeters by 5.08 centimeters (2 inches by 2 inches). The specimen was removed from the desiccator and weighed immediately to the nearest 0.1 milligram. The specimen was immersed in 23° C. methylene chloride in a beaker for 30 minutes+/−0.5 seconds, removed from the beaker, air dried at 23° C. for 10 minutes+/−30 seconds, then weighed immediately. Methylene chloride absorption for Comparative Example 2, which used 0.12 dL/g monofunctional poly(arylene ether), could not be determined because good laminates were not formed. This illustrates that the monofunctional poly(arylene ether) was not soluble in the epoxy resin at 23° C. A well consolidated laminate of monofunctional poly(arylene ether) and epoxy could be formed due to the lack of a homogeneous mixture. The monofunctional poly(arylene ether) in epoxy decreased the interlamellar adhesion of the prepreg, which inhibited the ability to make a laminate. In contrast, the use of bifunctional poly(arylene ether) in Examples 1-3 enabled the formation of good laminates. The bifunctional poly(arylene ether) was soluble in the epoxy resin at 23° C. A well consolidated laminate of the bifunctional poly(arylene ether) was formed due to the homogeneous mixture of epoxy resin. The increased solubility of the bifunctional poly(arylene ether) in epoxy resin allowed for increased interlamellar adhesion of the prepreg, which formed a well consolidated laminate with enhanced dielectric properties and chemical resistance. In conclusion, the bifunctional poly(arylene ether) is preferential to monofunctional poly(arylene ether) for forming an epoxy laminate at 23° C.

The absorption of water was determined by a similar procedure except that water was substituted for methylene chloride, the immersion period was 24 hours instead of 30 minutes, and removal of surface water by a dry cloth was substituted for the air drying step.

TABLE 2

|  | C. Ex. 1 | Ex. 1 | Ex. 2 | Ex. 3 | C. Ex. 2 |
|---|---|---|---|---|---|
| Compositions | | | | | |
| Toluene | 130 | 346 | 346 | 346 | 346 |
| Epoxy resin | 200 | 200 | 200 | 200 | 200 |
| Curing catalyst | 31.0 | 31.0 | 31.0 | 31.0 | 31.0 |
| Curing co-catalyst | 0.80 | 0.80 | 0.80 | 0.80 | 0.80 |
| PPE, 0.06, bifxl. | 0 | 160 | 0 | 0 | 0 |
| PPE, 0.09, bifxl. | 0 | 0 | 160 | 0 | 0 |
| PPE, 0.12, bifxl. | 0 | 0 | 0 | 160 | 0 |
| PPE, 0.12, monofxl. | 0 | 0 | 0 | 0 | 160 |
| Properties | | | | | |
| Water absorbed (wt %) | 1.38 | 0.15 | 0.04 | 0.05 | — |
| $CH_2Cl_2$ absorbed (wt %) | 1.75 | 0.79 | 0.68 | 1.29 | — |
| $D_k$ at 2.4 GHz | 3.26 | 3.09 | 3.26 | 3.39 | — |
| $D_f$ at 2.4 GHz | 0.014 | 0.005 | 0.010 | 0.015 | — |

It can be seen from Examples 1-3 that the incorporation of low intrinsic viscosity, bifunctional poly(arylene ether) into the resin increases the chemical resistance of the laminate as demonstrated by the decrease in water and methylene chloride absorption versus the poly(arylene ether)-free sample, Comparative Example 1. In some instances, the incorporation of the low intrinsic viscosity, bifunctional poly(arylene ether) also improves the dielectric behavior of the laminate. Example 1 showed a significant decrease (improvement) in $D_k$ and $D_f$ versus Comparative Example 1. Example 2 showed a slight decrease (improvement) in $D_f$ while $D_k$ remained constant, and Example 3 showed slight increases (degradations) in both $D_k$ and $D_f$ values. Thus, compositions comprising bifunctional poly(arylene ether)s having an intrinsic viscosity below 0.12 deciliter per gram provide significant improvements in dielectric properties.

EXAMPLES 4-15, COMPARATIVE EXAMPLES 3-10

These examples illustrate variation in curable composition viscosity as a function of solvent amount and poly(arylene ether) type and amount.

For Comparative Example 3 and Examples 4-15, the epoxy resin and the bifunctional poly(arylene ether)s are described above. Comparative Examples 4-11 used a different epoxy resin and different poly(arylene ether)s. The epoxy resin was a high purity bisphenol A diglycidyl ether obtained as D.E.R. 332 from Dow. The poly(arylene ether)s were acetic anhydride capped bifunctional poly(arylene ether)s ("PPE(Ac)$_2$" in Table 3) having intrinsic viscosities of 0.06 and 0.12 deciliters per gram (in other words, the terminal hydroxy groups of the bifunctional poly(arylene ether)s had been converted to acetate esters). Compositions are presented in Table 3, where all component amounts are expressed in parts by weight.

Viscosity values, expressing in units of centipoise (cps), were measured at 23° C. and 50° C. using a Brookfield digital Viscometer, Model DV-II, following the procedure in the accompanying Manufacturing Operation Manual No. m/85-160-G. Results are presented in Table 3.

The results for Comparative Example 3 and Examples 4-15, show that even when high concentrations of the bifunctional poly(arylene ether) are present, the compositions exhibit viscosities suitable for use in a prepreg manufacturing process. The viscosity values are all less than that of the neat epoxy resin, and they are all less than 300 centipoise. The results of Example 4 compared to Example 6 indicate that as the intrinsic viscosity of the bifunctional poly(arylene ether) in epoxy resin decreases, the flowability of the resin increases. The flowability of resin is important for wet-out and adhesion to the glass reinforcement, and consistent resin incorporation is needed for each prepreg to allow for interlamellar adhesion of the laminate. The bifunctionality of poly(arylene ether) enhanced processing conditions for laminate. The bifunctionality of the poly(arylene ether) allowed for processing at 23° C., whereas the curable composition comprising monofunctional poly(arylene ether) could not be processed at 23° C. The bifunctional poly(arylene ether) showed increased solubility in epoxy resin, forming a homogenous resin mixture. The homogenous resin mixture is critical for good interlamellar adhesion for a well-consolidated laminate. In contrast, a monofunctional poly (arylene ether) exhibited decreased solubility in epoxy resin, which lacked a homogeneous resin mixture. Therefore, the monofunctional poly (arylene ether) could not make a well-consolidated laminate.

EXAMPLES 16-102

Results for solubility of monofunctional and bifunctional poly (arylene ether) are presented in Tables 4-12. The results show solubility of bifunctional (arylene ether) in toluene, methyl ethyl ketone, chloroform, and N,N-dimethylformamide. The bifunctional poly(arylene ether) is soluble up to 60 weight percent in toluene and methyl ethyl ketone up to 7 days. In contrast, 0.06 IV monofunctional poly(arylene ether) had an initial solubility up to 50 weight percent in methyl ethyl ketone, but formed a precipitate after 1 day. In some embodiments, methyl ethyl ketone may be preferred over toluene as solvent for the lamination process. Specifically, when the resin is cured with hot air, methyl ethyl ketone may be a preferred solvent. When the resin mixture is cured by infrared radiation, then a mixture of ketones and toluene is typically preferred. Bifunctional poly(arylene ether) is soluble up to 50 weight percent in chloroform up to 7 days. A 0.06 IV bifunctional poly (arylene ether) is soluble up to 60 weight percent in N,N-dimethylformamide, and 0.09 IV bifunctional poly(arylene ether) is soluble up to 50 weight percent in N,N-dimethylformamide up to 7 days. The enhanced solubility of bifunctional poly(arylene ether) enables the bifunctional poly(arylene ether) to dissolve in various solvents, which provides processing flexibility compared to monofunctional poly(arylene ether).

TABLE 3

| | C. Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 | Ex. 15 |
|---|---|---|---|---|---|---|---|---|---|---|---|---|---|
| Compositions | | | | | | | | | | | | | |
| D.E.R. 321 Epoxy | 100 | 85.5 | 85.5 | 85.5 | 85.5 | 85.5 | 85.5 | 49.5 | 49.5 | 49.5 | 49.5 | 49.5 | 49.5 |
| D.E.R. 332 Epoxy | 0 | 0 | 0 | 0 | 0 | 0 | 0 | 0 | 0 | 0 | 0 | 0 | 0 |
| PPE, 0.06, bifxl. | 0 | 4.5 | 4.5 | 0 | 0 | 0 | 0 | 40.5 | 40.5 | 0 | 0 | 0 | 0 |
| PPE, 0.09, bifxl. | 0 | 0 | 0 | 4.5 | 4.5 | 0 | 0 | 0 | 0 | 40.5 | 40.5 | 0 | 0 |
| PPE, 0.12, bifxl. | 0 | 0 | 0 | 0 | 0 | 4.5 | 4.5 | 0 | 0 | 0 | 0 | 40.5 | 40.5 |
| PPE(Ac)$_2$, 0.06 | 0 | 0 | 0 | 0 | 0 | 0 | 0 | 0 | 0 | 0 | 0 | 0 | 0 |
| PPE(Ac)$_2$, 0.12 | 0 | 0 | 0 | 0 | 0 | 0 | 0 | 0 | 0 | 0 | 0 | 0 | 0 |
| Toluene | 0 | 10 | 20 | 10 | 20 | 10 | 20 | 30 | 40 | 30 | 40 | 30 | 40 |
| Properties | | | | | | | | | | | | | |
| Viscosity, 23° C. (cps) | 788 | 123 | 53.6 | 262 | 79 | 279 | 95 | 123 | 53.6 | 262 | 79 | 279 | 95 |
| Viscosity, 50° C. (cps) | — | — | — | — | — | — | — | — | — | — | — | — | — |

| | C. Ex. 4 | C. Ex. 5 | C. Ex. 6 | C. Ex. 7 | C. Ex. 8 | C. Ex. 9 | C. Ex. 10 |
|---|---|---|---|---|---|---|---|
| Compositions | | | | | | | |
| D.E.R. 321 Epoxy | 0 | 0 | 0 | 0 | 0 | 0 | 0 |
| D.E.R. 332 Epoxy | 100 | 90 | 80 | 70 | 90 | 80 | 70 |
| PPE, 0.06, bifxl. | 0 | 0 | 0 | 0 | 0 | 0 | 0 |
| PPE, 0.09, bifxl. | 0 | 0 | 0 | 0 | 0 | 0 | 0 |
| PPE, 0.12, bifxl. | 0 | 0 | 0 | 0 | 0 | 0 | 0 |
| PPE(Ac)$_2$, 0.06 | 0 | 10 | 20 | 30 | 0 | 0 | 0 |
| PPE(Ac)$_2$, 0.12 | 0 | 0 | 0 | 0 | 10 | 20 | 30 |
| Toluene | 0 | 0 | 0 | 0 | 0 | 0 | 0 |
| Properties | | | | | | | |
| Viscosity, 23° C. (cps) | 4,352 | 18,240 | 67,200 | 217,000 | 45,600 | 2,500,000 | * |
| Viscosity, 50° C. (cps) | 264 | 1,152 | 1,680 | 7,640 | 8,280 | 16,840 | 68,000 |

* viscosity too high to measure

TABLE 4

|  | Ex. 16 | Ex. 17 | Ex. 18 | Ex. 19 | Ex. 20 | Ex. 21 | Ex. 22 | Ex. 23 | Ex. 24 | Ex. 25 | Ex. 26 |
|---|---|---|---|---|---|---|---|---|---|---|---|
| PPE 0.06 bifxl. (wt %) | 10 | 15 | 20 | 25 | 30 | 35 | 40 | 45 | 50 | 55 | 60 |
| PPE 0.06 bifxl. (g) | 3.69 | 5.60 | 7.54 | 9.52 | 11.54 | 13.61 | 15.72 | 17.87 | 20.07 | 22.32 | 24.61 |
| Toluene (g) | 35.51 | 33.77 | 32.00 | 30.21 | 28.40 | 26.56 | 24.69 | 22.79 | 20.87 | 18.92 | 16.94 |
| Initial solubility | sol | sol | sol | sol | sol | sol | sol | sol | sol | sol | sol |
| 7-day Solubility | sol | sol | sol | sol | sol | sol | sol | sol | sol | sol | sol |
| Viscosity (cps) | NA | NA | NA | NA | NA | NA | 81 | 132 | 265 | 475 | NA |

TABLE 5

|  | Ex. 27 | Ex. 28 | Ex. 29 | Ex. 30 | Ex. 31 | Ex. 32 | Ex. 33 | Ex. 34 | Ex. 35 | Ex. 36 | Ex. 37 |
|---|---|---|---|---|---|---|---|---|---|---|---|
| PPE 0.09 bifxl. (wt %) | 10 | 15 | 20 | 25 | 30 | 35 | 40 | 45 | 50 | 55 | 60 |
| PPE 0.09 bifxl. (g) | 3.69 | 5.60 | 7.54 | 9.52 | 11.54 | 13.61 | 15.72 | 17.87 | 20.07 | 22.32 | 24.61 |
| Toluene (g) | 35.51 | 33.77 | 32.00 | 30.21 | 28.40 | 26.56 | 24.69 | 22.79 | 20.87 | 18.92 | 16.94 |
| Initial solubility | sol | sol | sol | sol | sol | sol | sol | sol | sol | sol | sol |
| 7-day Solubility | sol | sol | sol | sol | sol | sol | sol | sol | sol | sol | sol |
| Viscosity (cps) | NA | NA | NA | NA | NA | NA | 269 | 427 | 660 | 1479 | NA |

TABLE 6

|  | Ex. 38 | Ex. 39 | Ex. 40 | Ex. 41 | Ex. 42 | Ex. 43 | Ex. 44 | Ex. 45 | Ex. 46 | Ex. 47 | Ex. 48 |
|---|---|---|---|---|---|---|---|---|---|---|---|
| PPE 0.06 monofxl. (wt %) | 10 | 15 | 20 | 25 | 30 | 35 | 40 | 45 | 50 | 55 | 60 |
| PPE 0.06 monofxl. (g) | 3.69 | 5.60 | 7.54 | 9.52 | 11.54 | 13.61 | 15.72 | 17.87 | 20.07 | 22.32 | 24.61 |
| MEK (g) | 35.51 | 33.77 | 32.00 | 30.21 | 28.40 | 26.56 | 24.69 | 22.79 | 20.87 | 18.92 | 16.94 |
| Initial solubility | sol | sol | sol | sol | sol | sol | sol | sol | sol | insol | insol |
| 7-day Solubility | ppt | ppt | ppt | ppt | ppt | ppt | ppt | ppt | ppt | insol | insol |
| Days soluble | 1 | 1 | 1 | 1 | 1 | 1 | 1 | 1 | 1 | — | — |

TABLE 7

|  | Ex. 49 | Ex. 50 | Ex. 51 | Ex. 52 | Ex. 53 | Ex. 54 | Ex. 55 | Ex. 56 | Ex. 57 | Ex. 58 | Ex. 59 |
|---|---|---|---|---|---|---|---|---|---|---|---|
| PPE 0.06 bifxl. (wt %) | 10 | 15 | 20 | 25 | 30 | 35 | 40 | 45 | 50 | 55 | 60 |
| PPE 0.06 bifxl. (g) | 3.69 | 5.60 | 7.54 | 9.52 | 11.54 | 13.61 | 15.72 | 17.87 | 20.07 | 22.32 | 24.61 |
| MEK (g) | 35.51 | 33.77 | 32.00 | 30.21 | 28.40 | 26.56 | 24.69 | 22.79 | 20.87 | 18.92 | 16.94 |
| Initial solubility | sol | sol | sol | sol | sol | sol | sol | sol | sol | sol | sol |
| 7-day Solubility | sol | sol | sol | sol | sol | sol | sol | sol | sol | sol | sol |
| Viscosity (cps) | NA | NA | NA | NA | NA | NA | 12 | 50 | 205 | 760 | 3200 |

TABLE 8

|  | Ex. 60 | Ex. 61 | Ex. 62 | Ex. 63 | Ex. 64 | Ex. 65 | Ex. 66 | Ex. 67 | Ex. 68 | Ex. 69 | Ex. 70 |
|---|---|---|---|---|---|---|---|---|---|---|---|
| PPE 0.09 bifxl. (wt %) | 10 | 15 | 20 | 25 | 30 | 35 | 40 | 45 | 50 | 55 | 60 |
| PPE 0.09 bifxl. (g) | 3.69 | 5.60 | 7.54 | 9.52 | 11.54 | 13.61 | 15.72 | 17.87 | 20.07 | 22.32 | 24.61 |
| MEK (g) | 35.51 | 33.77 | 32.00 | 30.21 | 28.40 | 26.56 | 24.69 | 22.79 | 20.87 | 18.92 | 16.94 |
| Initial solubility | sol | sol | sol | sol | sol | sol | sol | sol | sol | sol | sol |
| 7-day Solubility | sol | sol | sol | sol | sol | sol | sol | sol | sol | sol | sol |
| Viscosity (cps) | NA | NA | NA | NA | NA | NA | 20 | 81 | 362 | 1380 | 6438 |

TABLE 9

|  | Ex. 71 | Ex. 72 | Ex. 73 | Ex. 74 | Ex. 75 | Ex. 76 | Ex. 77 | Ex. 78 |
|---|---|---|---|---|---|---|---|---|
| PPE 0.06 bifxl. (wt %) | 20 | 25 | 30 | 40 | 45 | 50 | 60 | 70 |
| PPE 0.06 bifxl. (g) | 8.46 | 10.58 | 12.69 | 16.92 | 19.03 | 21.15 | 25.38 | 29.61 |
| Chloroform (g) | 33.84 | 31.72 | 29.61 | 25.38 | 23.26 | 21.15 | 16.92 | 12.69 |
| Initial solubility | sol | sol | sol | sol | sol | sol | insol | insol |
| 7-day Solubility | sol | sol | sol | sol | sol | sol | insol | insol |

TABLE 10

|  | Ex. 79 | Ex. 80 | Ex. 81 | Ex. 82 | Ex. 83 | Ex. 84 | Ex. 85 | Ex. 86 |
|---|---|---|---|---|---|---|---|---|
| PPE 0.09 bifxl. (wt %) | 20 | 25 | 30 | 40 | 45 | 50 | 60 | 70 |
| PPE 0.09 bifxl. (g) | 8.46 | 10.58 | 12.69 | 16.92 | 19.03 | 21.15 | 25.38 | 29.61 |
| Chloroform (g) | 33.84 | 31.72 | 29.61 | 25.38 | 23.26 | 21.15 | 16.92 | 12.69 |
| Initial solubility | sol | sol | sol | sol | sol | sol | insol | insol |
| 7-day Solubility | sol | sol | sol | sol | sol | sol | insol | insol |

TABLE 11

|  | Ex. 87 | Ex. 88 | Ex. 89 | Ex. 90 | Ex. 91 | Ex. 92 | Ex. 93 | Ex. 94 |
|---|---|---|---|---|---|---|---|---|
| PPE 0.06 bifxl. (wt %) | 20 | 25 | 30 | 40 | 45 | 50 | 60 | 70 |
| PPE 0.06 bifxl. (g) | 8.46 | 10.58 | 12.69 | 16.92 | 19.03 | 21.15 | 25.38 | 29.61 |
| DMF (g) | 33.84 | 31.72 | 29.61 | 25.38 | 23.26 | 21.15 | 16.92 | 12.69 |
| Initial solubility | sol | sol | sol | sol | sol | sol | sol | sol |
| 7-day Solubility | sol | sol | sol | sol | sol | sol | sol | ppt |
| Days soluble | — | — | — | — | — | — | — | 1 |

TABLE 12

|  | Ex. 95 | Ex. 96 | Ex. 97 | Ex. 98 | Ex. 99 | Ex. 100 | Ex. 101 | Ex. 102 |
|---|---|---|---|---|---|---|---|---|
| PPE 0.09 bifxl. (wt %) | 20 | 25 | 30 | 40 | 45 | 50 | 60 | 70 |
| PPE 0.09 bifxl. (g) | 8.46 | 10.58 | 12.69 | 16.92 | 19.03 | 21.15 | 25.38 | 29.61 |
| DMF (g) | 33.84 | 31.72 | 29.61 | 25.38 | 23.26 | 21.15 | 16.92 | 12.69 |
| Initial solubility | sol | sol | sol | sol | sol | sol | sol | sol |
| 7-day Solubility | sol | sol | sol | sol | sol | sol | ppt | ppt |
| Days soluble | — | — | — | — | — | — | 1 | 1 |

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, of if they include equivalent structural elements with insubstantial differences from the literal language of the claims.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other.

The use of the terms "a" and "an" and "the" and similar referents in the context of describing the invention (especially in the context of the following claims) are to be construed to cover both the singular and the plural, unless otherwise indicated herein or clearly contradicted by context. Further, it should be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The invention claimed is:

1. A composite prepared by a method comprising:
   impregnating a reinforcing structure with a curable composition at a temperature of about 10 to about 40° C., wherein the curable composition comprises
   about 30 to about 80 parts by weight of an epoxy resin,
   about 20 to about 60 parts by weight of a polyfunctional poly(arylene ether) having a polydispersity index of 2 to 2.2, an intrinsic viscosity of about 0.03 to about 0.2 deciliter per gram measured in chloroform at 25° C., and a number average molecular weight less than or equal to 900 atomic mass units,
   about 2 to about 100 parts by weight of a solvent having an atmospheric boiling point of about 50 to about 250° C., and
   an amount of a curing promoter effective to cure the epoxy resin;
   wherein all parts by weight are based on 100 parts by weight total of the epoxy resin and the polyfunctional poly(arylene ether); and
   wherein the composite exhibits one or more of
   a water absorption less than or equal to 0.2 weight percent after 24 hours immersion in water at 23° C.;
   a methylene chloride absorption less than or equal to 1.3 weight percent after 30 minutes immersion in methylene chloride at 23° C. followed by 10 minutes in air at 23° C.;
   a dielectric constant less than or equal to 3.4 measured at 23° C. and 2.4 gigahertz; and
   a dissipation factor less than or equal to 0.015 measured at 23° C. and 2.4 gigahertz.

2. The composite of claim 1, wherein the polyfunctional poly(arylene ether) is a bifunctional poly(arylene ether) having the structure

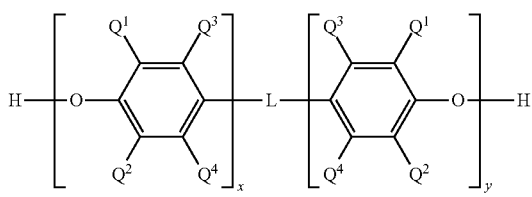

wherein $Q^1$ and $Q^2$ are identical within each phenylene ether unit and selected from the group consisting of halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; each occurrence of $Q^3$ and $Q^4$ is independently selected from the group consisting of hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; x and y are independently 0 to about 30 with the proviso that the sum of x and y is at least 2; and L has the structure

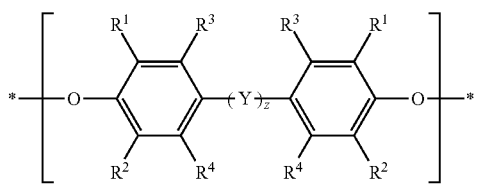

wherein each occurrence of $R^1$ and $R^2$ and $R^3$ and $R^4$ is independently selected from the group consisting of hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; z is 0 or 1; and Y has a structure selected from the group consisting of

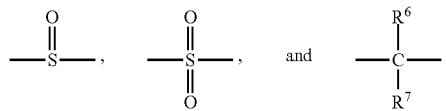

wherein each occurrence of $R^5$ is independently selected from the group consisting of hydrogen and $C_1$-$C_{12}$ hydrocarbyl, and each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

3. The composite of claim 2, wherein each occurrence of $Q^1$ and $Q^2$ is methyl, each occurrence of $Q^3$ is hydrogen, each occurrence of $Q^4$ is hydrogen or methyl, the sum of x and y is 2 to about 15, each occurrence of $R^1$ and $R^2$ and $R^3$ and $R^4$ is independently hydrogen or methyl, and Y has the structure

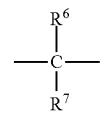

wherein each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

4. The composite of claim 1, wherein the polyfunctional poly(arylene ether) is a bifunctional poly(arylene ether) having the structure

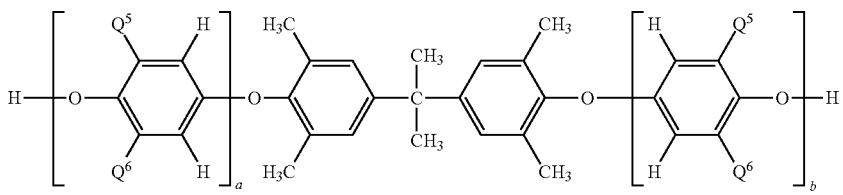

wherein each occurrence of $Q^5$ and $Q^6$ is independently methyl or di-n-butylaminomethyl; and each occurrence of a and b is independently 0 to about 20, with the proviso that the sum of a and b is at least 2.

5. The composite of claim 1, wherein the solvent comprises dimethylformamide.

6. A printed circuit board, comprising:
a composite formed by a method comprising laminating a plurality of prepregs;
wherein the prepregs are formed by a method comprising impregnating a reinforcing fabric with a curable composition at a temperature of about 10 to about 40° C.;
wherein the curable composition comprises
about 30 to about 80 parts by weight of an epoxy resin,
about 20 to about 60 parts by weight of a bifunctional poly(arylene ether) having a polydispersity index of 2 to 2.2, an intrinsic viscosity of about 0.03 to about 0.2 deciliter per gram measured in chloroform at 25° C., and a number average molecular weight less than or equal to 900 atomic mass units, about 2 to about 100 parts by weight of a solvent having an atmospheric boiling point of about 50 to about 250° C., and an amount of a curing promoter effective to cure the epoxy resin;

wherein all parts by weight are based on 100 parts by weight total of the epoxy resin and the bifunctional poly(arylene ether).

7. The printed circuit board of claim 6, wherein the laminating a plurality of prepregs comprises exposing the plurality of prepregs to a temperature of about 175 to about 205° C. and a pressure of about 17 to about 23 megapascals, and further exposing the plurality of prepregs to a temperature of about 185 to about 215° C. and a pressure of about 32 to about 40 megapascals.

8. The printed circuit board of claim 6, wherein the bifunctional poly(arylene ether) has the structure

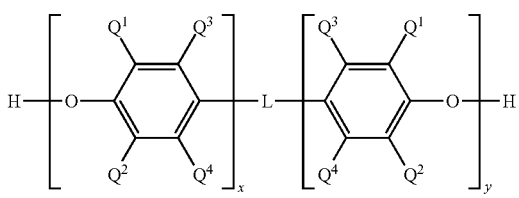

wherein $Q^1$ and $Q^2$ are identical within each phenylene ether unit and selected from the group consisting of halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; each occurrence of $Q^3$ and $Q^4$ is independently selected from the group consisting of hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; x and y are independently 0 to about 30 with the proviso that the sum of x and y is at least 2; and L has the structure

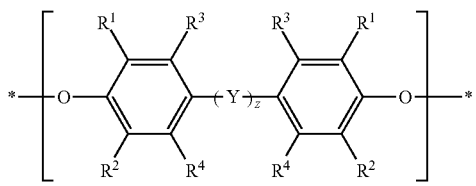

wherein each occurrence of $R^1$ and $R^2$ and $R^3$ and $R^4$ is independently selected from the group consisting of hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; z is 0 or 1; and Y has a structure selected from the group consisting of

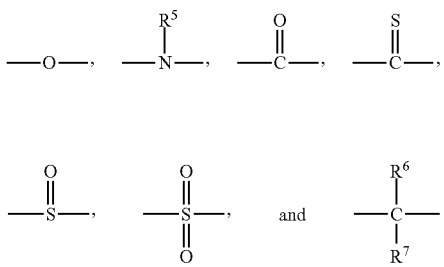

wherein each occurrence of $R^5$ is independently selected from the group consisting of hydrogen and $C_1$-$C_{12}$ hydrocarbyl, and each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

9. The printed circuit board of claim 8, wherein each occurrence of $Q^1$ and $Q^2$ is methyl, each occurrence of $Q^3$ is hydrogen, each occurrence of $Q^4$ is hydrogen or methyl, the sum of x and y is 2 to about 15, each occurrence of $R^1$ and $R^2$ and $R^3$ and $R^4$ is independently hydrogen or methyl, and Y has the structure

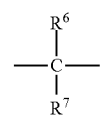

wherein each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

10. The printed circuit board of claim 6, wherein the bifunctional poly(arylene ether) has the structure

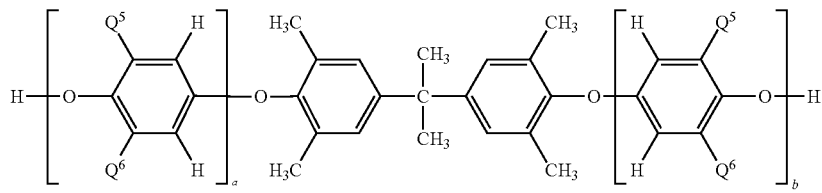

wherein each occurrence of $Q^5$ and $Q^6$ is independently methyl or di-n-butylaminomethyl; and each occurrence of a and b is independently 0 to about 20, with the proviso that the sum of a and b is at least 2.

11. The printed circuit board of claim 6, wherein the solvent comprises dimethylformamide.

12. A printed circuit board, comprising:
a composite formed by a method comprising laminating a plurality of prepregs;
wherein the prepregs are formed by a method comprising impregnating a reinforcing fabric with a curable composition at a temperature of about 10 to about 40° C.;
wherein the curable composition consists of
about 30 to about 80 parts by weight of an epoxy resin,
about 20 to about 60 parts by weight of a bifunctional poly(arylene ether) having a polydispersity index of 2 to 2.2, an intrinsic viscosity of about 0.03 to about 0.2 deciliter per gram measured in chloroform at 25° C., and a number average molecular weight less than or equal to 900 atomic mass units,
about 2 to about 100 parts by weight of a solvent having an atmospheric boiling point of about 50 to about 250° C.,
an amount of a curing promoter effective to cure the epoxy resin, and
optionally, an additive selected from the group consisting of dyes, pigments, colorants, antioxidants, heat stabilizers, light stabilizers, plasticizers, lubricants, flow modifiers, drip retardants, flame retardants, anti-blocking agents, antistatic agents, flow-promoting agents, processing aids, substrate adhesion agents, mold release agents, toughening agents, low-profile additives, stress-relief additives, and combinations thereof;
wherein all parts by weight are based on 100 parts by weight total of the epoxy resin and the bifunctional poly(arylene ether).

13. The printed circuit board of claim 12, wherein the bifunctional poly(arylene ether) has the structure

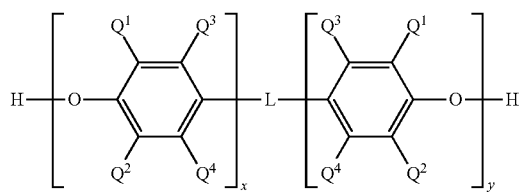

wherein $Q^1$ and $Q^2$ are identical within each phenylene ether unit and selected from the group consisting of halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; each occurrence of $Q^3$ and $Q^4$ is independently selected from the group consisting of hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; x and y are independently 0 to about 30 with the proviso that the sum of x and y is at least 2; and L has the structure

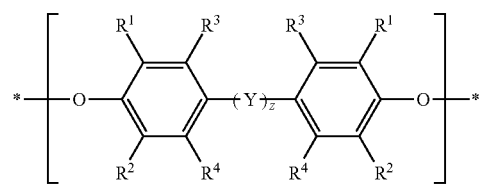

wherein each occurrence of $R^1$ and $R^2$ and $R^3$ and $R^4$ independently selected from the group consisting of hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; z is 0 or 1; and Y has a structure selected from the group consisting of

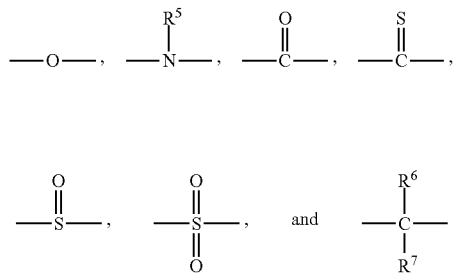

wherein each occurrence of $R^5$ is independently selected from the group consisting of hydrogen and $C_1$-$C_{12}$ hydrocarbyl, and each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

14. The printed circuit board of claim 13, wherein each occurrence of $Q^1$ and $Q^2$ is methyl, each occurrence of $Q^3$ is hydrogen, each occurrence of $Q^4$ is hydrogen or methyl, the sum of x and y is 2 to about 15, each occurrence of $R^1$ and $R^2$ and $R^3$ and $R^4$ is independently hydrogen or methyl, and Y has the structure

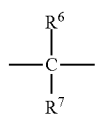

wherein each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

15. The printed circuit board of claim 12, wherein the bifunctional poly(arylene ether) has the structure

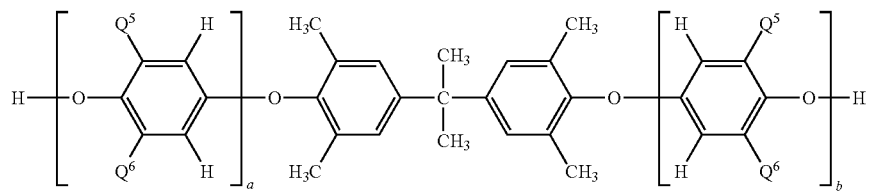

wherein each occurrence of $Q^5$ and $Q^6$ is independently methyl or di-n-butylaminomethyl; and each occurrence of a and b is independently 0 to about 20, with the proviso that the sum of a and b is at least 2.

16. The printed circuit board of claim 12, wherein the solvent comprises dimethylformamide.

* * * * *